United States Patent
Ho

(10) Patent No.: US 9,286,430 B1
(45) Date of Patent: *Mar. 15, 2016

(54) HIERARCHICAL VISUALIZATION-BASED ANALYSIS OF INTEGRATED CIRCUITS

(71) Applicant: WorldWide Pro Ltd., Hong Kong (CN)

(72) Inventor: William Wai Yan Ho, San Jose, CA (US)

(73) Assignee: Worldwide Pro Ltd., Hong Kong (CN)

(*) Notice: Subject to any disclaimer, the term of this patent is extended or adjusted under 35 U.S.C. 154(b) by 0 days.

This patent is subject to a terminal disclaimer.

(21) Appl. No.: 14/196,971

(22) Filed: Mar. 4, 2014

Related U.S. Application Data

(63) Continuation of application No. 13/134,700, filed on Jun. 13, 2011, now Pat. No. 8,667,455.

(60) Provisional application No. 61/354,189, filed on Jun. 11, 2010, provisional application No. 61/354,186, filed on Jun. 11, 2010.

(51) Int. Cl.
    *G06F 17/50* (2006.01)
(52) U.S. Cl.
    CPC ................... *G06F 17/5068* (2013.01)
(58) Field of Classification Search
    CPC .............. G06F 17/5068; G06F 17/5081
    USPC .......... 716/100–107, 110–111, 119–122, 139
    See application file for complete search history.

(56) References Cited

U.S. PATENT DOCUMENTS

| | | | |
|---|---|---|---|
| 4,775,950 A | 10/1988 | Terada et al. | |
| 5,379,231 A | 1/1995 | Pillage et al. | |
| 5,446,676 A | 8/1995 | Huang et al. | |
| 6,807,520 B1 | 10/2004 | Zhou et al. | |
| 7,353,157 B2 | 4/2008 | Wasynczuk et al. | |
| 2007/0171733 A1 | 7/2007 | Wood | |
| 2008/0072190 A1 | 3/2008 | Jain et al. | |
| 2009/0055789 A1* | 2/2009 | McIlrath | 716/10 |
| 2010/0287515 A1 | 11/2010 | Hedman et al. | |

OTHER PUBLICATIONS

Klinger, V., "DiPaCS: A New Concept for Parallel Circuit Simulation", Simulation Symposium, 1995, Proceedings of the 28th Annual, Apr. 9-13, 1995, pp. 32-41.

* cited by examiner

*Primary Examiner* — Paul Dinh
(74) *Attorney, Agent, or Firm* — Aka Chan LLP

(57) ABSTRACT

A system or technique provides for a hierarchical visual-based analysis of electrical integrated circuit system simulation results. A 3D visualization may be used to identify and conduct an analysis of the integrated circuit. An analysis is done on a specific feature of the integrated circuit that is visible in the 3D visualization. The specific feature may be one that is obscured by other layers of the integrated circuit visualization.

20 Claims, 23 Drawing Sheets

```
1    <resistor>
2      <type> rectangle </type>
3      <layer> ct1 </layer>
4      <coord> 2.0 3.0 4.0 3.5 </coord>
5      <node1> N20 </node1>
6      <node2> N21 </node2>
7      <value> 30.0 </value>
8    </resistor>
```

```
1    *Sample netlist
2    R1 n1 n2 30
3    R2 n2 n3 20
4    R3 n3 n4 10
5    R4 n4 0 5 2
6    Va n1 0 2
7    Ib n2 0 0.2
8    Vc n3 0 dc 0 pwl (0.0 2.0 1.0ns 1.2)
9    Id n4 0 dc 0 pwl (0.0 0.2 1.5ns -.1)
10   .end
```

HIERARCHICAL VISUALIZATION-BASED ANALYSIS OF INTEGRATED CIRCUITS

CROSS-REFERENCE TO RELATED APPLICATIONS

This patent application is a continuation of U.S. patent application Ser. No. 13/134,700, filed Jun. 13, 2011, issued as U.S. Pat. No. 8,667,455 on Mar. 4, 2014, which claims the benefit of U.S. provisional patent applications 61/354,186 and 61/354,189, both filed Jun. 11, 2010. These applications are incorporated by reference along with all other cited references in the application.

BACKGROUND OF THE INVENTION

The invention relates to the design and analysis of integrated circuits, and more specifically, to methods and systems for performing a hierarchical visualization-based analysis of integrated circuits.

The age of information and electronic commerce has been made possible by the development of electronic circuits and their miniaturization through integrated circuit technology. Integrated circuits are sometimes referred to as "chips." To meet the challenges of building more complex and higher performance integrated circuits, software tools are used. These tools are in an area commonly referred to as computer aided design (CAD), computer aided engineering (CAE), or electronic design automation (EDA). There is a constant need to improve these electronic automatic tools in order to address the desire for higher integration and greater complexity, and better performance in integrated circuits.

In nanoscale integrated circuit technology, a large and complex circuit is challenging to design. The circuit can be strongly impacted by nanoscale process variations and nanoscale materials or device physics limitations.

Software tools can be used to design and verify a layout of an integrated circuit. Currently, software tools provide a top-down two-dimensional (2D) layout of an integrated circuit. In a 2D layout, overlayers typically hide underlayers. This complicates an engineer's task of viewing and interpreting cause and effect contextually when overlayers are made transparent or hidden.

Therefore, what is needed is a system and technique to enable visualization, isolation, and interpretation of localized electrical effects of integrated circuits.

BRIEF SUMMARY OF THE INVENTION

A system or technique provides a hierarchical visualization-based analysis of integrated circuit system simulation. The invention advances the state-of-art in visualization-based electrical analysis of integrated circuits.

The invention provides a method for three-dimensional (3D) hierarchical visualization-based analysis of complex electrical integrated circuit system simulation results. A 3D visualization enables a rapid and easy way to identify and conduct analyses including root-case, what-if, and sensitivity analysis.

In an implementation, 3D viewing with semitransparent layers is used. In another implementation, a user can zoom-in or zoom-out, tilt, or rotate the 3D view to facilitate viewing. In another implementation, physical features are color-mapped to electrical results or functions of electrical results enabling IR drop, electromigration, transient excursions, out-of-bounds errors, or other values. For example, the features may be colored to indicate the level of voltage on each. In yet another implementation, hierarchical cells or features are made visible or hidden to isolate geometries.

A technique of the invention provides a 3D hierarchical visual layout of a circuit. A method is provided for a 3D hierarchical or flat mode for electrical analysis and viewing for layout structures. In an implementation, a contextual hierarchical electrical analysis is provided. In another implementation, a method is provided for localized "what-if" analysis, local updating, or engineering change orders. This may identify features which are engineering change order features in the 3D layout. In this implementation, these may be features which are "fragile" in the sense that they are not a part of the design database. In another implementation, this identifies features based upon network name, instance, or hierarchical cell. In yet another implementation, interblock electrical issues are identified, visualized, and isolated hierarchically.

A method is provided for a multi-domain composite mode. In an implementation, data fusion of both analysis and layout visualization is provided. For example, a (current-resistance) IR drop view can be superimposed on a thermal map in 2D or 3D.

A method is further provided for a movie mode. In an implementation, the movie mode provides a movie of multiple timing vectors, multiple static or dynamic power grid vectors, or other simulation progression through time or other domain. This can show continuous visualization as a circuit is either stepped through various timing vectors or swept through frequency or other input conditions.

A method is provided for providing a 3D spot magnifier. In a 2D or 3D mode, a 3D magnification popup can provide quick local 3D focused viewing. A method is provided for editing in 3D mode. A method is further provided for 3D probing (scope, voltmeter, ammeter, or power meter). In an implementation, a 3D structure is probed for an electrical or conditional state of a circuit.

A method is provided for 3D analysis invocation. In an implementation, this includes identifying a 3D feature of an element by clicking on the 3D feature such that simulation can be invoked. A method is further provided for 3D user interface issues. In an implementation, this includes hovering, clicking, or measuring. In an implementation, 3D hyperlinks are provided. This enables drilling down into simulation data or past history through yield data.

A method is provided for a 3D hierarchical visualization-based analysis using integrated circuit system simulation results. In an implementation, 3D hierarchical (or flat) mode for analysis and viewing of electrical results is provided. In an implementation, a user can zoom-in or zoom-out, tilt, or rotate the view to facilitate viewing of electrically annotated 3D layout structures. In another implementation, physical features are color-mapped to electrical results or functions of electrical results enabling IR drop, electromigration, transient excursions, out-of-bounds errors, or other values. This enables the IR voltage drop distribution along a long power bus to be visualized. In another implementation, current or current density is displayed with a different output mode setting. In yet another implementation, network connectivity tracing in 3D is provided.

In another implementation, selective transparency is provided such that physical features may be made semitransparent. This makes it easier to see other features. In an implementation, hierarchical cells or features may be made visible or hidden or uniquely identified with color, tags, or shading to isolate geometries. In another implementation, contextual hierarchical electrical analysis is provided. That is, this implementation displays hierarchical identification (e.g. via in a hierarchically-named via array) which is on a power rail connecting to a named instance of a named hierarchical subcircuit. In this implementation, information relevant to the purpose of the feature is enabled, such as IR voltage drop, average power, or peak current density.

In an implementation, the invention includes: formatting for display on a computer screen a layout of integrated circuit design in a two-dimensional view, where the integrated circuit design is specified in an design database, the layout comprise multiple layers, and in the two-dimensional view, the different layers of the layout overlap when two or more layers cross each other on the screen; allowing the user to identify a portion of the layout of the integrated circuit design using a pointer; displaying on the screen a zoomed in view of the portion of the layout identified by the user; providing an option for the user to enable a three-dimensional view of the layout; after enabling the three-dimensional view option, allowing the user to select a center point of rotation in the two-dimensional view screen; after the center point is selected, while the user moves the pointer relative to the center point, showing on the screen and rotating, in real time, a three-dimensional view of the portion of the layout identified by the user, where the rotation is based on the movement of the pointer relative to the selected center point; allowing the user to select a feature of the layout on the screen with the pointer and request showing a property of that selected feature; and displaying a value for the property of the selected feature on the screen. In an implementation, the property is not stored in the design database, but stored in a simulation results database. In another implementation, different colors are used to represent different property values. There may be two or more colors used (e.g., three, four, five, or six colors). In an implementation, the property is a resistance value. In another implementation the property is an IR drop.

Other objects, features, and advantages of the invention will become apparent upon consideration of the following detailed description and the accompanying drawings, in which like reference designations represent like features throughout the figures.

DETAILED DESCRIPTION OF THE INVENTION

Figure 1:
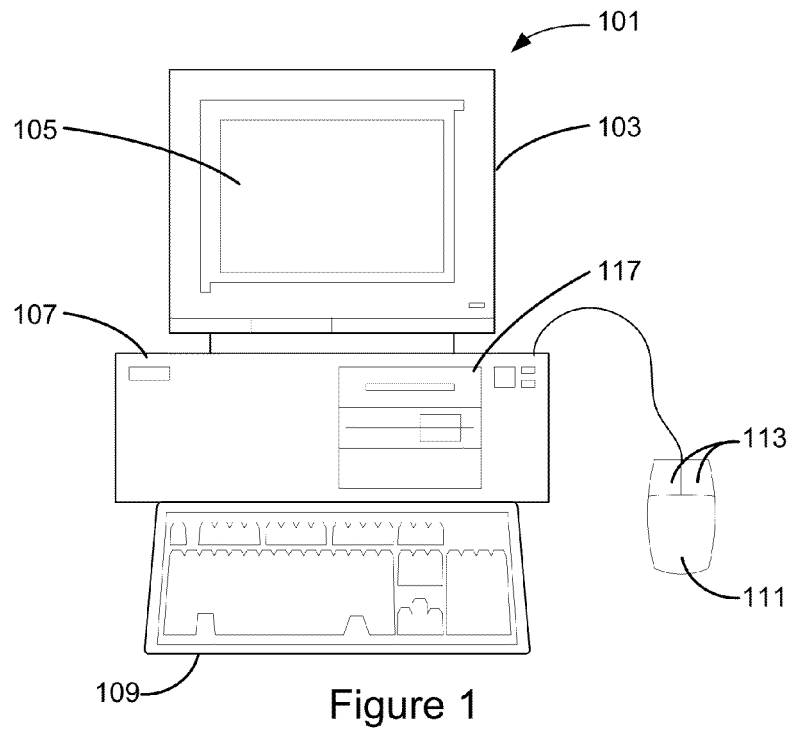
FIG. 1 shows a system of the invention for performing a hierarchical visualization-based analysis of integrated circuits.

FIG. 1 shows a system of the invention for performing a hierarchical visualization-based analysis of integrated circuits. In an embodiment, the invention is software that executes on a computer workstation system, such as shown in FIG. 1. FIG. 1 shows a computer system 101 that includes a monitor 103, screen 105, cabinet 107, keyboard 109, and mouse 111. In some implementations, however, the modeling and simulating systems are operated headless, which means these systems will not have a mouse, keyboard, display, and so forth. Mouse 111 may have one or more buttons such as mouse buttons 113. Cabinet 107 houses familiar computer components, some of which are not shown, such as a processor, memory, mass storage devices 117, and the like.

Sample devices used for selecting or as a pointers in this application include mouse, stylus, touch screen, touch pad, or tablet.

Mass storage devices 117 may include mass disk drives, floppy disks, magnetic disks, optical disks, magneto-optical disks, fixed disks, hard disks, CD-ROMs, recordable CDs, DVDs, recordable DVDs (e.g., DVD-R, DVD+R, DVD-RW, DVD+RW, HD-DVD, or Blu-ray Disc), flash and other non-volatile solid-state storage (e.g., USB flash drive), battery-backed-up volatile memory, tape storage, reader, and other similar media, and combinations of these. A binary machine-executable version of the software of the invention may be stored or reside on mass storage devices 117. Furthermore, the source code of the software of the invention may also be stored or reside on mass storage devices 117 (e.g., magnetic disk, tape, CD-ROM, or DVD).

A computer-implemented version of the invention may be embodied using, or reside on, computer readable medium. A computer-readable medium may include any medium that participates in providing instructions to one or more processors for execution. Such a medium may take many forms including, but not limited to, nonvolatile, volatile, and transmission media. Nonvolatile media includes, for example, flash memory or optical or magnetic disks. Volatile media includes static or dynamic memory, such as cache memory or RAM. Transmission media includes coaxial cables, copper wire, fiber optic lines, and wires arranged in a bus. Transmission media can also take the form of electromagnetic, radio frequency, acoustic, or light waves, such as those generated during radio wave and infrared data communications.

For example, a binary, machine-executable version, of the software of the invention may be stored or reside in RAM or cache memory, or on mass storage device 117. The source code of the software of the invention may also be stored or reside on mass storage device 117 (e.g., hard disk, magnetic disk, tape, or CD-ROM). As a further example, code of the invention may be transmitted via wires, radio waves, or through a network such as the Internet.

Figure 2:
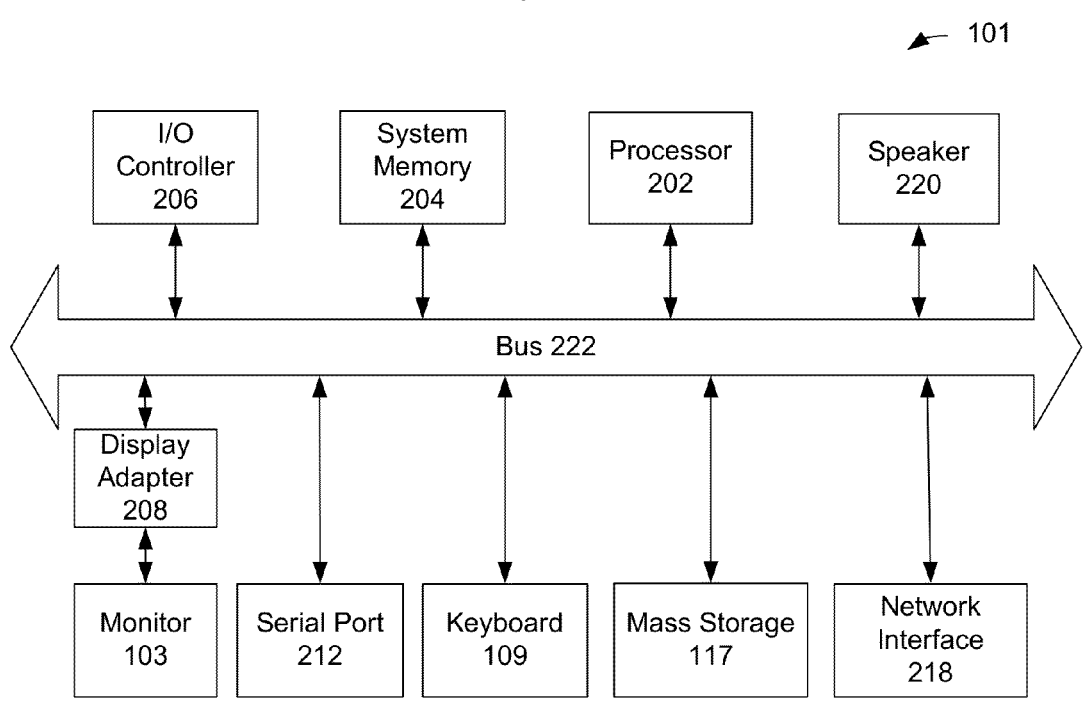
FIG. 2 shows a simplified system block diagram of a computer system used to execute software of the invention.

FIG. 2 shows a system block diagram of computer system 101 used to execute software of the invention. As in FIG. 1, computer system 101 includes monitor 103, keyboard 109, and mass storage devices 117. Computer system 101 further includes subsystems such as central processor 202, system memory 204, input/output (I/O) controller 206, display adapter 208, serial or universal serial bus (USB) port 212, network interface 218, and speaker 220. The invention may also be used with computer systems with additional or fewer subsystems. For example, a computer system could include more than one processor 202 (i.e., a multiprocessor system) or the system may include a cache memory.

The processor may be a dual core or multicore processor, where there are multiple processor cores on a single integrated circuit. The system may also be part of a distributed computing environment. In a distributed computing environment, individual computing systems are connected to a network and are available to lend computing resources to another system in the network as needed. The network may be an internal ethernet network, Internet, or other network. Some examples of distributed computer systems for solving problems over the Internet include Folding@home, SETI@home, and the Great Internet Mersenne Prime Search (GIMPS).

Arrows such as 222 represent the system bus architecture of computer system 101. However, these arrows are illustrative of any interconnection scheme serving to link the subsystems. For example, speaker 220 could be connected to the other subsystems through a port or have an internal connection to central processor 202. Computer system 101 shown in FIG. 1 is but an example of a computer system suitable for use with the invention. Other configurations of subsystems suitable for use with the invention will be readily apparent to one of ordinary skill in the art.

Computer software products may be written in any of various suitable programming languages, such as C, C++, C#, Pascal, Fortran, Perl, MatLab (from MathWorks, Inc.), SAS, SPSS, Java, JavaScript, and AJAX. The computer software product may be an independent application with data input and data display modules. Alternatively, the computer software products may be classes that may be instantiated as distributed objects. The computer software products may also be component software such as Java Beans (from Oracle) or Enterprise Java Beans (EJB from Oracle).

An operating system for the system may be one of the Microsoft Windows® family of operating systems (e.g., Windows 95, 98, Me, Windows NT, Windows 2000, Windows XP, Windows XP x64 Edition, Windows Vista, Windows 7, Windows CE, Windows Mobile), Linux, HP-UX, UNIX, Sun OS, Solaris, Mac OS X, Alpha OS, AIX, IRIX32, or IRIX64, or combinations of these. Other operating systems may be used. Each computer in a distributed computing environment may use a different operating system.

Furthermore, the computer may be connected to a network and may interface to other computers using this network. For example, each computer in the network may perform part of the task of the many series of circuit simulation steps in parallel. Furthermore, the network may be an intranet, internet, or the Internet, among others. The network may be a wired network (e.g., using copper), telephone network (e.g., public switch telephone network or PSTN), packet network, an optical network (e.g., using optical fiber), or a wireless network, or any combination thereof. For example, data and other information may be passed between the computer and components (or steps) of a system of the invention using a wireless network using a protocol such as Wi-Fi (IEEE standards 802.11, 802.11a, 802.11b, 802.11e, 802.11g, 802.11i, and 802.11n, just to name a few examples). For example, signals from a computer may be transferred, at least in part, wirelessly to components or other computers.

This application incorporates by reference U.S. patent application Ser. No. 13/159,384, filed Jun. 11, 2011, and all references cited in that application.

A specific type of electronic design automation tool is a circuit simulation program or system. A circuit simulation program performs analysis of circuits containing resistors, capacitors, inductors, mutual inductors, independent voltage and current sources, dependent sources, transmission lines, and semiconductor devices including diodes, bipolar junction transistors (BJTs), junction field effect transistors (JFETs), and metal over semiconductor field effect transistors (MOSFETs). A circuit simulator may perform nonlinear DC, nonlinear transient, linear AC, and other analyses.

One circuit simulation program is SPICE, originating from the University of California, Berkeley. SPICE stands for "Simulation Program Integrated Circuits Especially!" Despite the success of SPICE and other circuit simulation programs, existing circuit simulation programs use methodology and computational techniques not suitable for use in distributed computing environment and determining real or exact solutions.

Visualization-based analysis of power issues, such as IR drop, has been shown in top-down 2D applications. In a 2D view, the region of interest is typically hidden by many overlayers. It would be desirable to hide these overlayers to see the problem. However in doing so, context may be lost.

A technique of the invention provides for a 3D visualization of electrically-annotated features. This method overcomes inherent limitations of 2D visualization where features are typically hidden by overlayers. The method is especially useful in gigascale chips which are impacted strongly by nanoscale physical variations because one can see the impacted features in their electrical context more clearly.

Further, one can annotate information onto 3D features which can provide a means for drilling down into data attached to that annotation or obtaining contextual information about the feature. These annotations are discussed and can be applied in the same implementation.

There are many benefits of visual display of simulation results and verification errors. Electrical simulation results may be mapped onto a physical circuit or layout in a 2D sense and the results displayed in a 2D manner. This allows a current-resistance (IR) voltage drop or high average power domains to be shown to enable problem isolation. Unfortunately, with this approach, critical physical layer features may be hidden by overlayers making it difficult to see problems especially in the context of features above the problem area. A technique of the invention makes use of both 3D visualization as well as hierarchical display filtering to enable better viewing of these features.

Figure 3A:
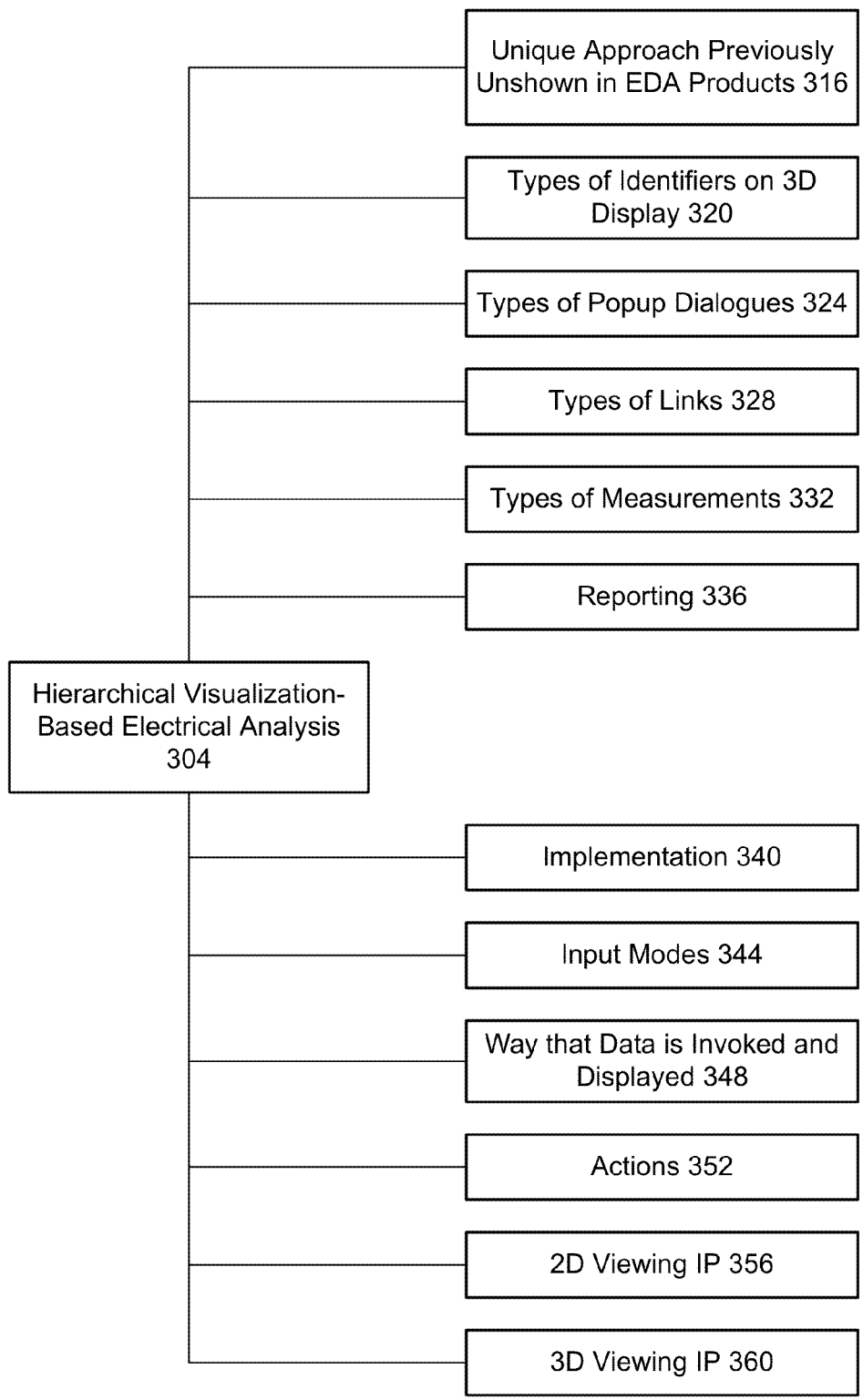
FIGS. 3A-3B describe a hierarchical visualization-based electrical analysis.
Figure 3B:
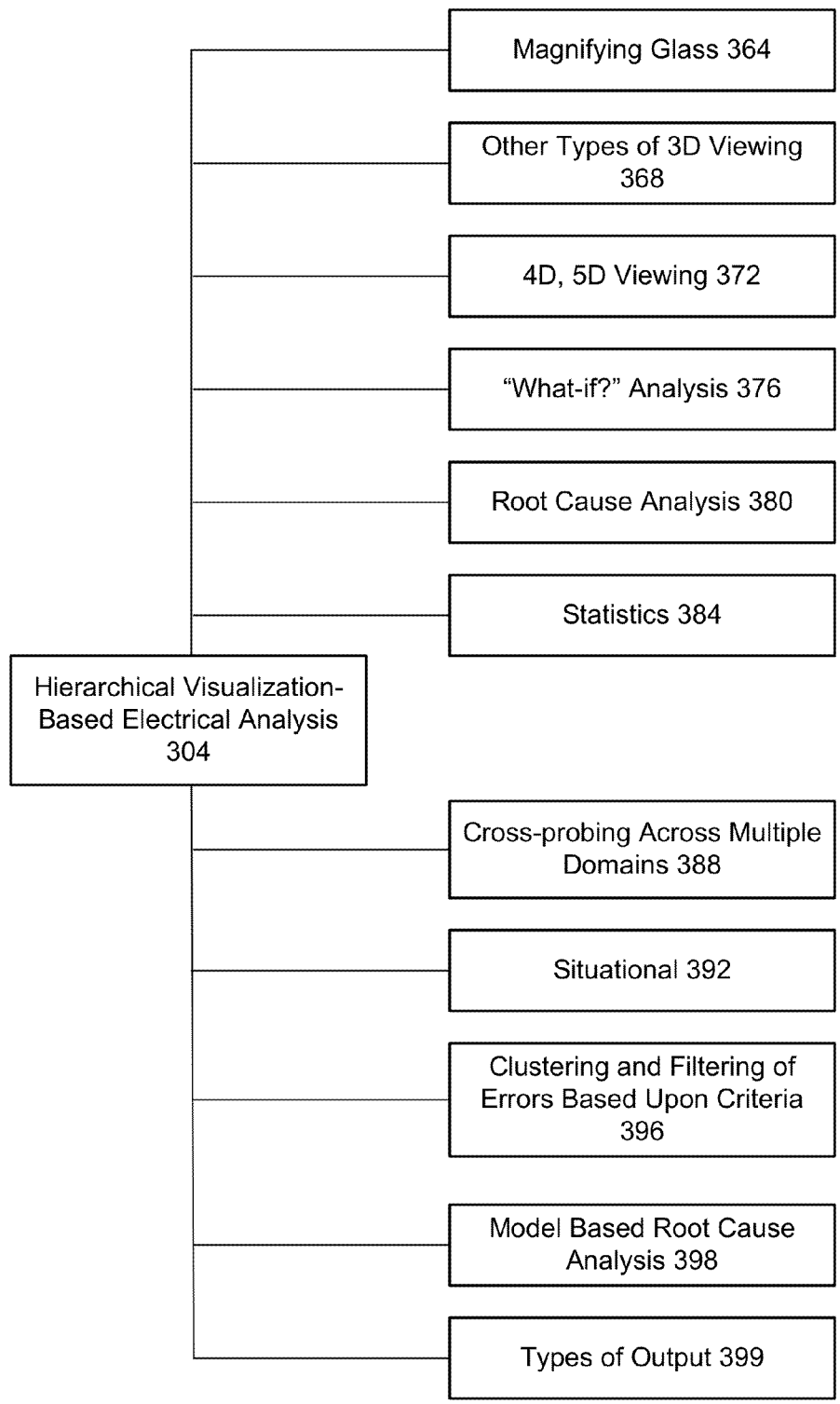

FIGS. 3A-3B show a diagram describing a hierarchical visualization-based electrical analysis 304. The diagram shows features and descriptions of the analysis, such as a new approach in EDA products 316, types of identifiers on 3D display 320, types of popup dialogues 324, types of links 328, types of measurements 332, reporting 336, implementation 340, input modes 344, way that data is invoked and displayed 348, actions 352, 2D viewing IP 356, 3D viewing IP 360, magnifying glass 364, other Types of 3D viewing 368, 4D and 5D viewing 372, "What-if?" analysis 376, root cause analysis 380, statistics 384, cross-probing across multiple domains 388, situational 392, clustering and filtering of errors based upon criteria 396, model based root cause analysis 398, and types of output 399. More information on these features is below.

Figure 4:
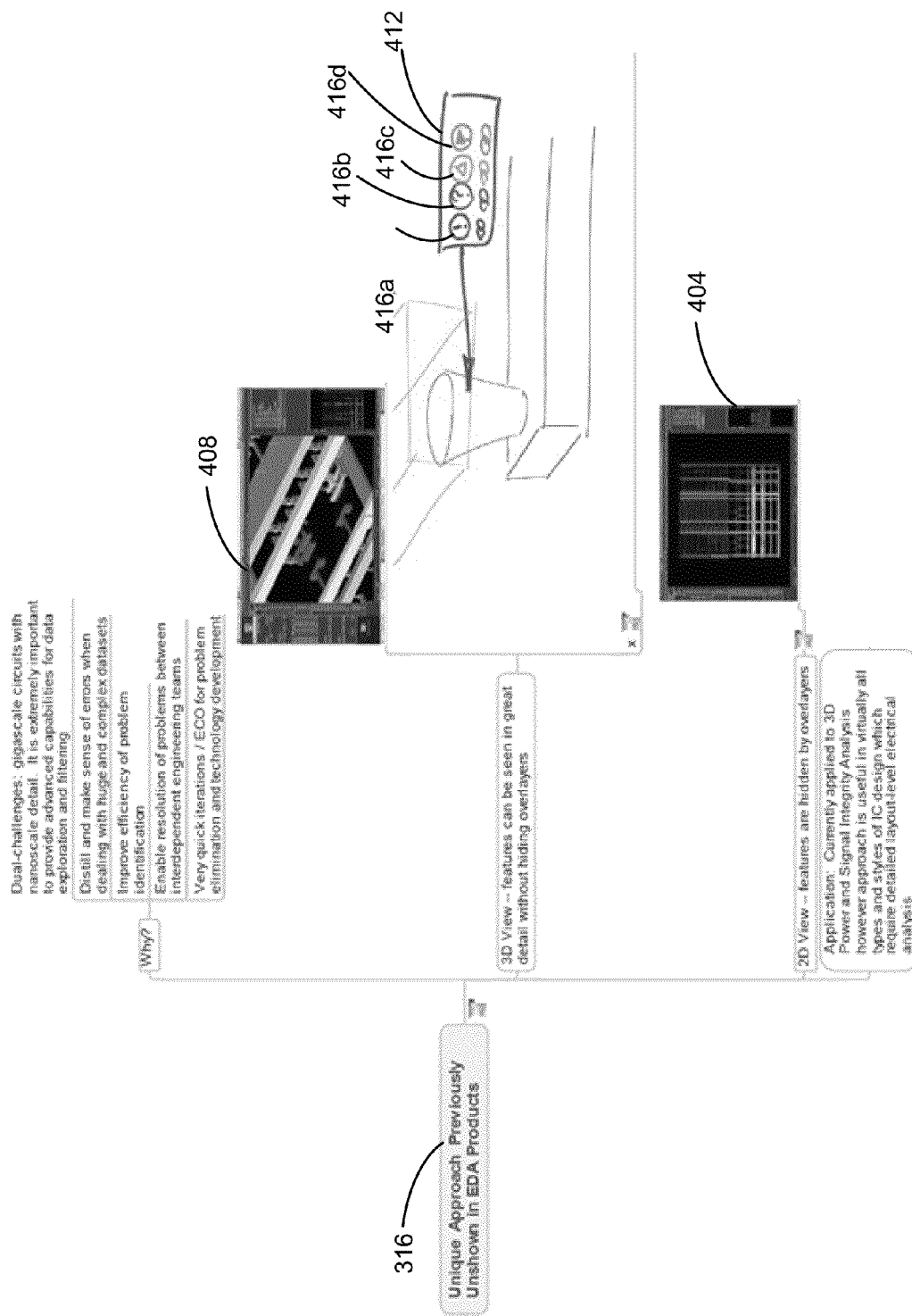
FIG. 4 shows an overview of the invention including a more detailed description of the new approach for EDA products.

FIG. 4 shows an overview of the invention including a more detailed description of an approach for EDA products 316. The invention provides a solution to the dual-challenges of designing and analyzing gigascale circuits with nanoscale detail. It is important to provide advanced capabilities for data exploration and filtering. It is also important to distill and make sense of errors when dealing with huge and complex datasets, improve efficiency of program identification, enable resolution of problems between interdependent engineering teams, and provide quick iterations or engineering change order (ECO) for problem elimination and technology development.

FIG. 4 also shows examples of a 2D view or display 404 and a 3D view or display 408. In the 2D view, features of the circuit are hidden by overlayers. Spatial variations are due to IR drop. IR drop is a significant factor which should be considered in the design of a modern integrated circuit's power distribution network.

The tools of the invention are designed to detect problems with the integrated circuit, isolate them both within a netlist or schematic and the physical circuit layout. For example this includes finding a single bad (or potentially bad) via amongst billions of circuit and layout elements. Moreover, in an implementation, the invention also provides in-depth analysis, real-time analysis for what-if and engineering change option (ECO) modifications.

In the 3D view, features of the circuit can be seen in more detail without hiding overlayers. The 2D and 3D views are discussed in more detail in FIGS. 5-6 below.

The invention has utility. For example, it can be applied to 3D static and dynamic power analysis. Further, a technique is useful in a variety of types and styles of integrated circuit design which require detailed layout-level electrical analysis. For example, a technique of this invention can be applied to a 3D power and signal integrity analysis. Further, the invention is useful in virtually all types and styles of integrated circuit design which require detailed layout-level electrical analysis.

Furthermore, the invention can also be used for an ECO layout verification and analysis, design for manufacturability (DFM) layout verification and analysis, or current-resistance (IR) drop verification and analysis.

In an implementation, the 3D view provides icons to provide users information regarding the circuit. Icons can be used as verification identifiers graphically tagging features or regions which match certain rules or violate certain conditions. Icons may also be hyperlinks to report providing additional information. In an implementation, a 3D box 412 shows icons 416a-416d. These icons are discussed in more detail in FIG. 12 below.

Figure 5:
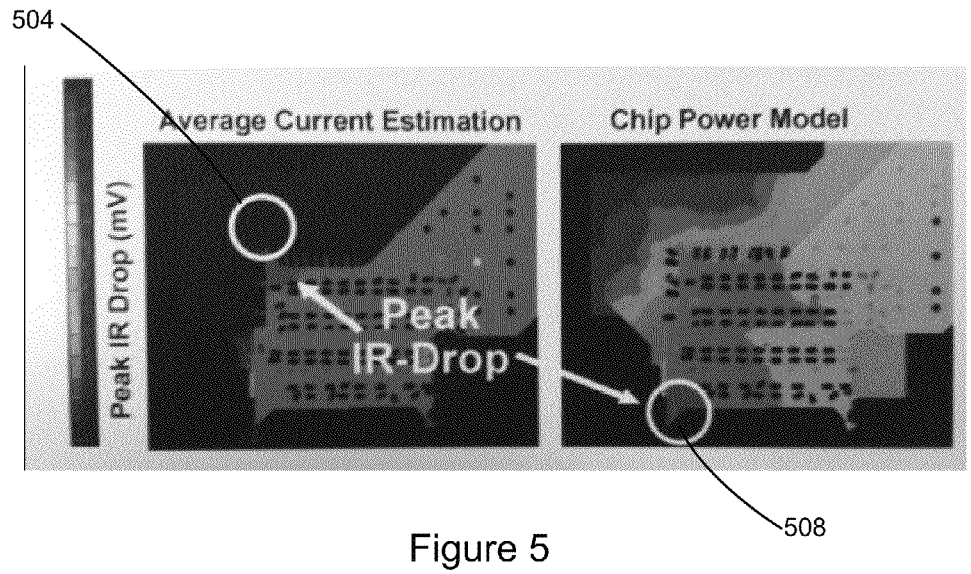
FIG. 5 shows examples of a 2D visualization of an integrated circuit.

FIG. 5 shows examples of a 2D visualization of an integrated circuit. The figure shows a "top-down" 2D viewing analysis of IR drop of an EDA product. FIG. 5 shows an average current based model of an integrated circuit and a chip power model of the integrated circuit. The average current based model provides an estimate of an integrated circuit's behavior. A chip power model is a model of a full-chip power delivery network.

In FIG. 5, in the average current based model, the peak IR drop in millivolts is identified as occurring in a specific corner by a circle 504. In the chip power model, the peak IR drop is identified as occurring in a specific corner by a circle 508. The peak IR drop the chip power model is shown to occur in a different corner than what was identified using the average current based model's "estimate" of the integrated circuit's behavior. Although the chip power model of the integrated circuit may provide a more accurate location of the peak IR drop than the average current based model, some critical features are still hidden by overlayers, making it difficult to see the problem in the integrated circuit, especially in the context of features above the problem area. It would be difficult to obtain a detailed view of a problem such as one high-IR drop via.

Figure 6:
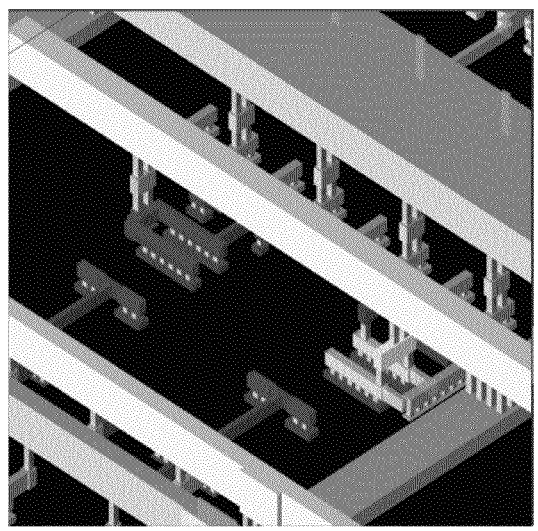
FIG. 6 shows an example of a 3D visualization.

FIG. 6 shows an example of a 3D visualization. The 3D hierarchical visualization enables focusing on deeply embedded features of the integrated circuit. The power of 3D visualization for localized IR drop analysis is shown. At this level of detail, one can visualize IR drop or other electrical issues clearly and in the context of the physical circuit features in the locale of a potential problem feature.

In an implementation, features are colored to indicate the level of voltage on each. In an implementation, spatial variations may be due to IR drop or inductive or capacitive transient effects which could be similarly visualized.

The invention can make use of both 3D visualization as well as hierarchical display filtering to enable better viewing of these features. 3D visualization facilitates quick isolation and interpretation of errors or analysis results such that a user can rotate, zoom, tilt, and shift a 3D semitransparent physical circuit to home in on a specific region of interest.

Circuit simulation technology enables an enormous amount of information to be acquired relevant to the function of each effective physical element in the circuit. That is, the nodal voltage, branch current, IR drop, electromigration, transient nodal voltage or current, and the like may all be available and one-to-one mappable to the physical layout along or through the wires or interconnect structures of the circuit.

This direct correspondence between a netlist and physical layout is important due to nanoscale process technology and materials or device physics due to the inherent sensitivities of distributed lumped-element values to dimensional variations, and also due to fundamental materials limitations such as with electromigration driven by high current density or reduced operating range tolerance of MOSFETs to local supply variations. The distribution of IR drop integrating to a low voltage condition is important and one may need to be able to find local problems quickly. This is an important augmentation of DFM technology wherein the electrical consequences of variations or marginal designs can be quickly found and mitigated.

Figure 7:
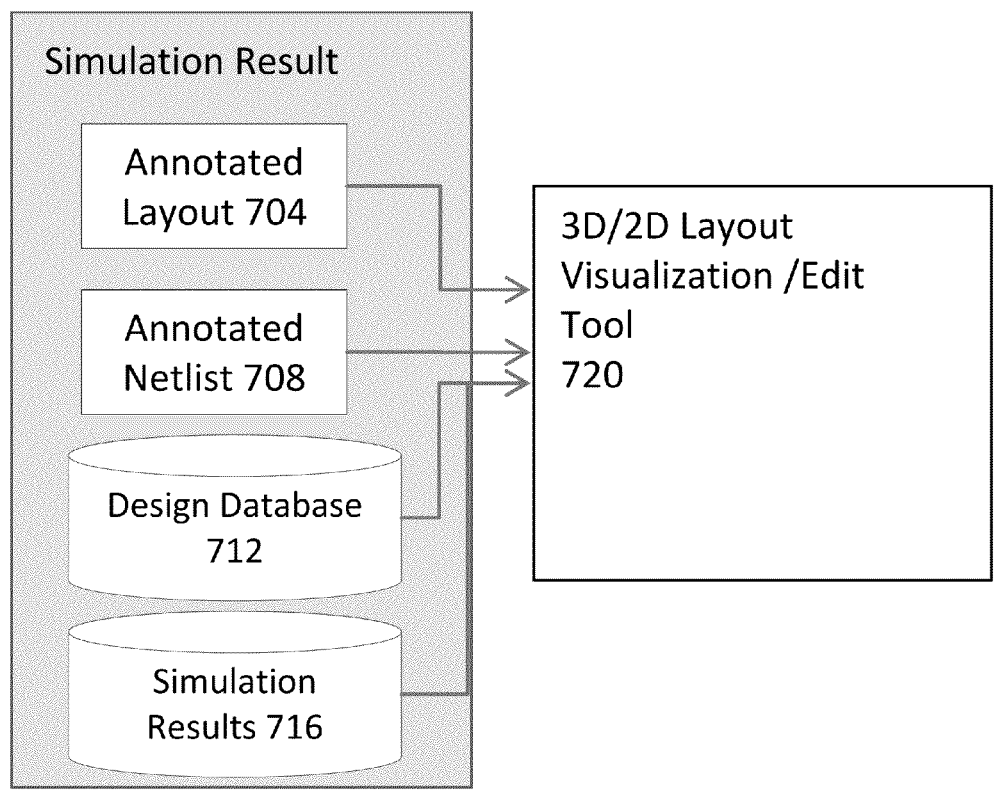
FIG. 7 shows a flow of an implementation of the invention for creating a 3D/2D layout visualization having an edit tool.

FIG. 7 shows a flow of an implementation of the invention for creating a 3D/2D layout visualization having an edit tool. A specific implementation of a flow for creating a 3D/2D layout visualization is presented in this patent, but it should be understood that the invention is not limited to the specific flow and steps presented. A flow of the invention may have additional steps (not necessarily described in this application), different steps which replace some of the steps presented, fewer steps or a subset of the steps presented, or steps in a different or alternative order than presented, or any combination of these. Certain steps may be repeated as needed. Further, the steps in other implementations of the invention may not be exactly the same as the steps presented and may be modified or altered as appropriate for a particular application or based on the circumstances.

Using an annotated layout 704, annotated netlist 708, design database 712, and simulation results 716 as inputs, 3D/2D layout visualization with an edit tool 720 is created.

The annotated layout and annotated netlist describe the circuitry to be simulated or evaluated. The annotated netlist specifies the components and connectivity of the circuitry. Components can include gates, devices, transistors, cells, logic blocks, input buffers, output buffers, memory cells, decoders, arithmetic logic unit (ALU), and other circuit blocks. The connectivity includes power and ground wiring (carrying respectively, VDD and 0 volts) and the signal interconnect, which carry Boolean signals (representing 0 or 1) that propagate between different logic blocks of the circuitry.

The annotated layout specifies the geometries of a layout of the circuitry. These geometries include the polygons for the various mask and process layers. When creating a polygon layout of an integrated circuit, a designer typically locates every conductor via and contact of every component.

The annotated netlist and annotated layout may be stored in a database file. For example, the circuit netlist may be specified using a schematic capture format, hardware description language (HDL) format, register transfer level (RTL) format, or other circuit description language. The layout may be stored in a GDSII format file. In an implementation, the physical layout of the layout is annotated. That is, it has correspondence to the netlist and simulation results. Voltage, current, power, or other values may be attached to physical geometries or referenced by netlist node identifiers.

In an implementation, the netlist is physically annotated. That is, the netlist has physical layout (x, y, z or layer) geometry correspondence. In an implementation, the hierarchical design database includes a hierarchical design with exact nodal correspondences to the netlist and layout.

In an implementation, the hierarchical simulation output is an output with exact nodal and hierarchical correspondences to the layout, netlist, and design database. Simulation results may be extensive and span a number of different verification types or types of analyses. For example, in an implementation, all nodal or branch values such as IR drop, current (and current density), electromigration affinity, average power, or delta voltage for transient analysis are analyzed or verified. In another implementation, some nodal or branch values such as IR drop, current (and current density), electromigration affinity, average power, or delta voltage for transient analysis are analyzed or verified.

The results of the simulations can be efficiently mapped onto a physical layout. The 3D visualization method enables one to see the spatio-temporal distribution to enable rapid problem isolation. The edit tool may be an interactive graphic program that allows a user to created and delete elements of layout.

Figures 8, 9A:
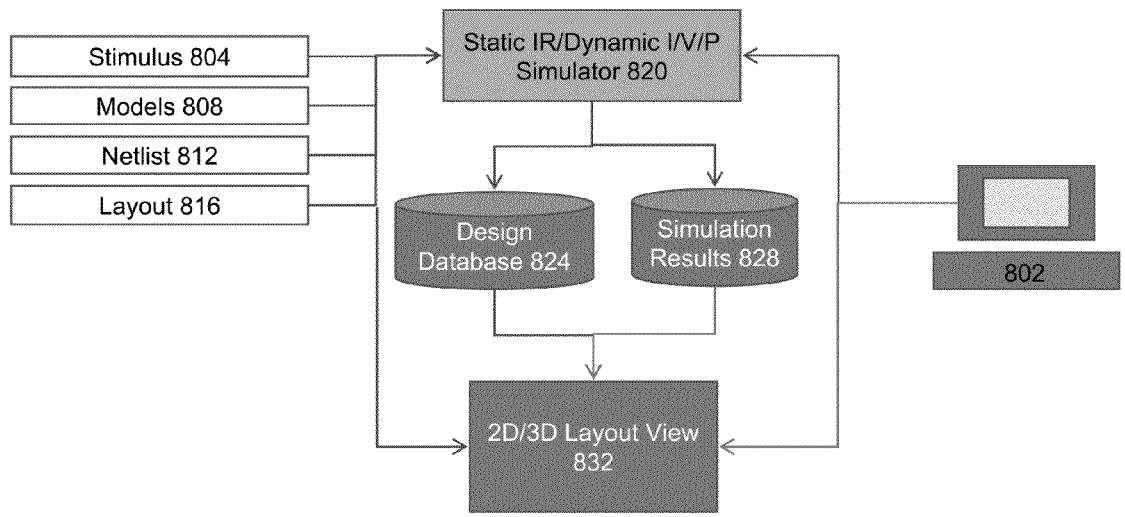
FIG. 8 shows another flow of an implementation of the invention for creating a 2D/3D layout view.
FIG. 9A shows a geometry type for a resistor described as a rectangle.

FIG. 8 shows another flow of an implementation of the invention for creating a 2D/3D layout view. Using a terminal 802 and stimulus 804, models 808, netlist 812, layout 816 as inputs into a static IR/dynamic IN/P simulator 820, a design 824 and simulation results 828 of an integrated circuit are created. The design and simulation results can be stored in a file, such as in a database file, for use by other processes or flows. The simulation may be performed in a distributed fashion, utilizing multiple processor cores or multiple computers, or both.

Using the stimulus, models, netlist, layout, and the design and simulation results from the static IR/dynamic IN/P simulator, a 2D/3D layout view 832 is created. In an implementation, all simulation results are one-to-one mapped to a 3D layout. This may be due to node or layout correspondence.

The dimensions and layers for the various electrical components may be provided to enable the mapping of electrical values unto the layout. In an implementation, the 2D/3D layout view describes an IR drop, current density, or electromigration lifetime viewing or verification of an integrated circuit.

Figures 9B, 9C:
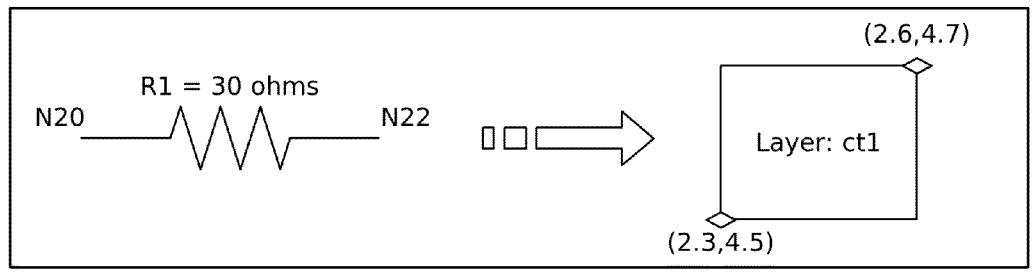
FIG. 9B shows a graphical illustration of converting the resistor geometry described in FIG. 9A to a layout having a rectangular geometry.
FIG. 9C shows a sample netlist that describes a circuit in a SPICE format.

FIGS. 9A-9C show an example of describing a geometry for a resistance. FIG. 9A shows a geometry type for a resistor described as a "rectangle" at line 1, layer number of the resistor "ct1" at line 2, X and Y coordinate "2.0" and "3.0," respectfully, for node1 "N20" at lines 3-4, X and Y coordinate "4.0" and "3.5," respectfully, for node2 "N21" at lines 3 and 5, and a value of 30.0 ohms for the resistor.

FIG. 9B shows a graphical illustration of converting the resistor geometry described in FIG. 9A to a layout having a rectangular geometry. A resistance"R1" of 30 ohms is between nodes N20 and N22. The resistance is drawn in the layout as a rectangle at layer ct1 having lower-left X and Y coordinates 2.3 and 4.5, respectfully, and having upper-right X and Y coordinates 2.6 and 4.7.

An input for the electrical simulation can be a standard SPICE netlist or other format that represents the electrical components and vectors that are simulated. The spice netlist along with the rectangle definitions enable the back-annotation of results back unto the layout.

FIG. 9C shows a sample netlist that describes a circuit in a SPICE format. In this implementation, the geometry for a resistance was described as a rectangle. The geometry of resistance, however, is not limited to specifying rectangular geometries. In other implementations, a geometry for a resistance can also specify polygons (e.g., squares) or other shaped geometries (e.g., cylinders).

Figure 10:
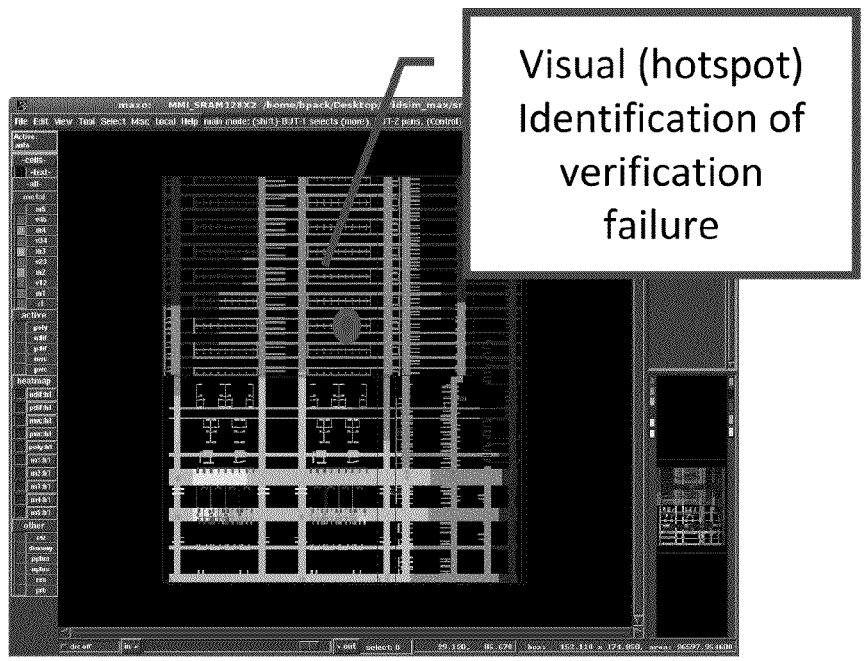
FIG. 10 shows a 2D layout view of an integrated circuit.
Figure 11A:
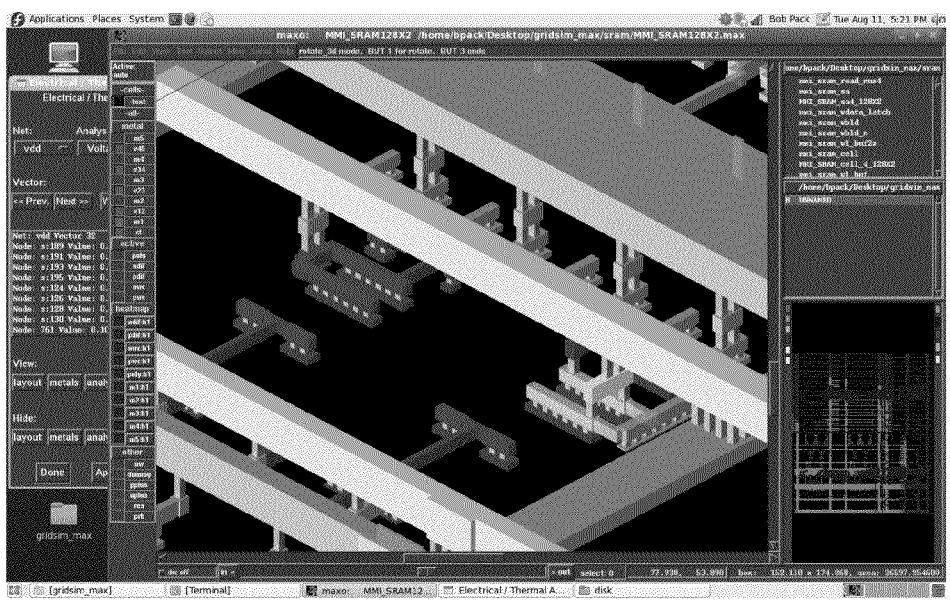
FIG. 11A shows a 3D view of the 2D layout view in FIG. 10.
Figure 11B:
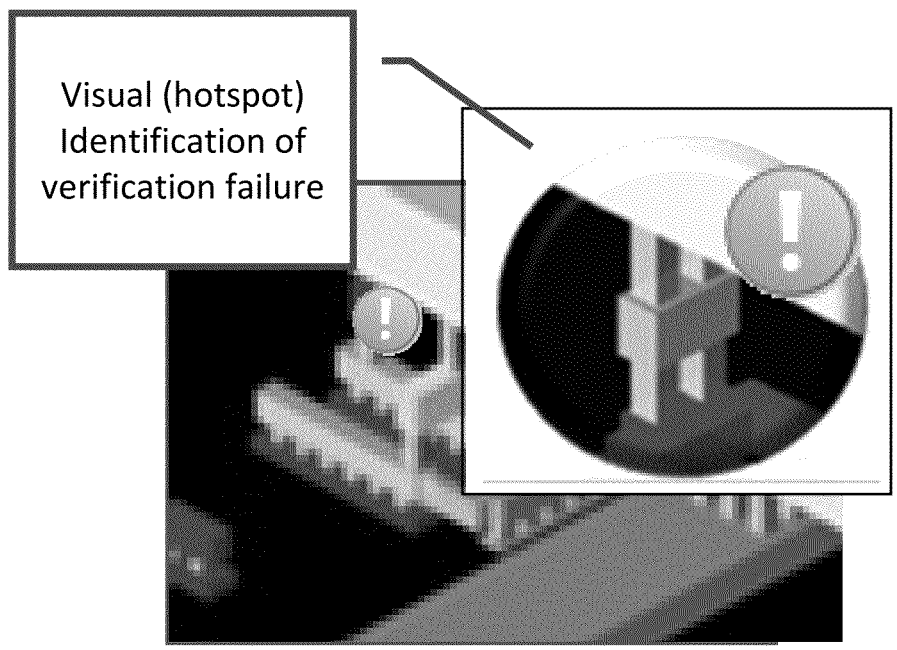
FIG. 11B shows a 3D close-up view of the visual (hotspot) identification of the verification failure.

FIGS. 10 and 11A-11B show an example of a 2D/3D layout view of an integrated circuit. In an implementation, the layout view shows a visualization of an IR drop, current density, or electromigration lifetime viewing or verification of the integrated circuit.

FIG. 10 shows a 2D layout view of the integrated circuit. A visual (hotspot) identification of verification failure is shown. Because of the limitations of a 2D view, a user is unable to see a more detailed view of the integrated circuit and its problem area.

FIGS. 11A-11B show a 3D layout view of the integrated circuit. FIG. 11A shows a 3D view of the 2D layout view in FIG. 10. The 3D view provides a closer look at the integrated circuit, including multiple layers of the integrated circuit.

FIG. 11B shows a 3D close-up view of the visual (hotspot) identification of the verification failure. A 3D visualization enables a user to find and see physical features which have electrical simulation values attached to them. These features may be directly annotated with a value or enable the simulation value to be obtained from a simulation database.

An engineer may also desire to visually choose and filter the data through 3D visual-data-choosing techniques. This enables the engineer to use the power of visual techniques to drill down appropriately into the database or to efficiently utilize this data to tag problems areas or even to provide hints for ECO.

An implementation of the invention enables visual mechanisms for tagging features in 3D to enable a user to find and see physical features which may violate or pass a specific rule, provide additional "drill-down" information, or provide information about what the feature is in context of the circuit or manufacturing context. An implementation of the invention enables identification of particular features in 3D to facilitate drill-down, contextual understanding, corrective hints, verification violations, or ECO identification.

In an implementation, a 2D view of an integrated circuit is given. The 2D view is converted into a 3D view. The integrated circuit has multiple layers, where a feature (e.g., via, resistor, inductor, gate, wire, interconnection) of the integrated circuit is in an underlayer that is obscured by an overlayer in the 2D view. A center point location of the integrated circuit is selected. This center point may be a location corresponding to a feature of the integrated circuit. The 3D view is then rotated or tilted with the center point at the center to create a tilted 3D view. In the tilted 3D view, a feature of the integrated circuit, not previously visible, becomes visible. This feature is selected and a simulation of the integrated circuit is run. The simulation can be based on adjustable parameters (e.g., time, voltage, input values) to the integrated circuit. A result of the simulation is generated. For example, the result can be the voltage at the feature during the simulation.

An example benefit of this is to allow more accurate integrated circuit design. In a 2D view, a chip designer can see the overall view of how the chip would operate, but it is difficult to pinpoint what is happening at a specific feature of the integrated circuit. The feature may be obscured by an overlay or the importance of the feature in the overall design of the integrated circuit may be missed. In a 3D view, the chip designer may have an easier time in understanding the overall design of the integrated circuit but information on a specific feature is not provided.

Figure 12:
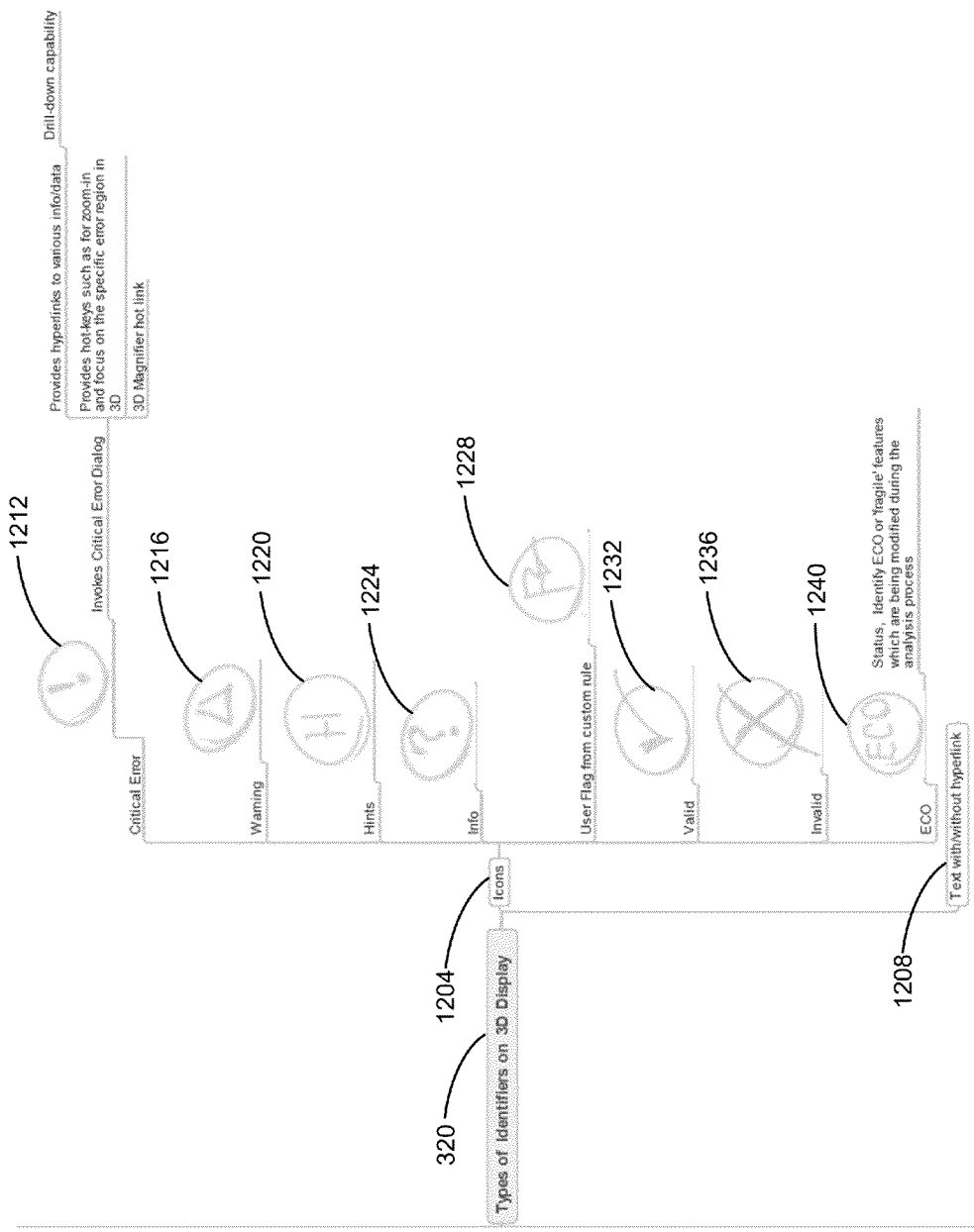
FIG. 12 shows examples of different types of identifiers that can appear in a layout display.

FIG. 12 shows examples of different types of identifiers that can appear in a layout display. Types of identifier on 3D display 320 (see FIG. 3A) are icons 1204 and text with or without a hyperlink 1208. Exemplary icons that can be used are a critical error icon 1212, a warning or caution icon 1216, a hints or hint available icon 1220, an info or information icon 1224, a user flag from custom rule or user-condition-flag icon 1228, a valid or condition-passed icon 1232, an invalid or condition-failed icon 1236, and an ECO icon 1240.

In an implementation, the critical error icon invokes a critical error dialog. In a specific implementation, the critical error icon hyperlinks to relevant information or data. For example, when a user clicks on the critical error icon on a display screen, a hyperlink to relevant information or data regarding the circuit is provided.

In another implementation, the critical error icon provides hot-keys. In this implementation, the critical error icon may provide for zooming-in and focusing on the feature or error regions in the 3D view. In another implementation, the critical error icon provides for a 3D magnifier hotlink. For example, when a user clicks on the critical error icon, a 3D magnifier hotlink appears that magnifies the critical area and allows a user to inspect the circuit. This may provide for a drill-down capability to drill down into the data.

In an implementation, the warning icon alerts a user of a potential defect or error in the circuit design. For example, if a warning icon pops up in a particular region of a 3D display, a user may be aware that the particular region may violate certain rules of conditions.

In an implementation, the hints or hint available icon provides a corrective action dialog to provide quick what-if based hints. In an implementation, the info or information icon can determine the context, criticality, or circuit sensitivity of particular features. In an implementation, a feature can be a power via and when the info icon is invoked, it shows the power via's place in the hierarchy. In another implementation, the info icon enables a user to drill down into statistics of this class's IR drop failure.

In an implementation, the user-condition-flag icon alerts a user where in the layout a user custom rule applies. In an implementation, the condition-passed icon informs a user that a particular condition or rule passed. In an implementation, the condition-failed icon informs a user that a particular condition or rule failed.

In an implementation, the ECO icon is used to indicate a status of the circuit. In another implementation, the ECO icon is used to identify ECO or fragile features which are being modified during the analysis process.

Although critical error, warning, hints, information, user-condition-flag, condition-passed, condition-failed, and ECO icons were discussed, a person skilled in the art would recognize that other icons can be used to inform a user of information regarding the circuit.

Figure 13:
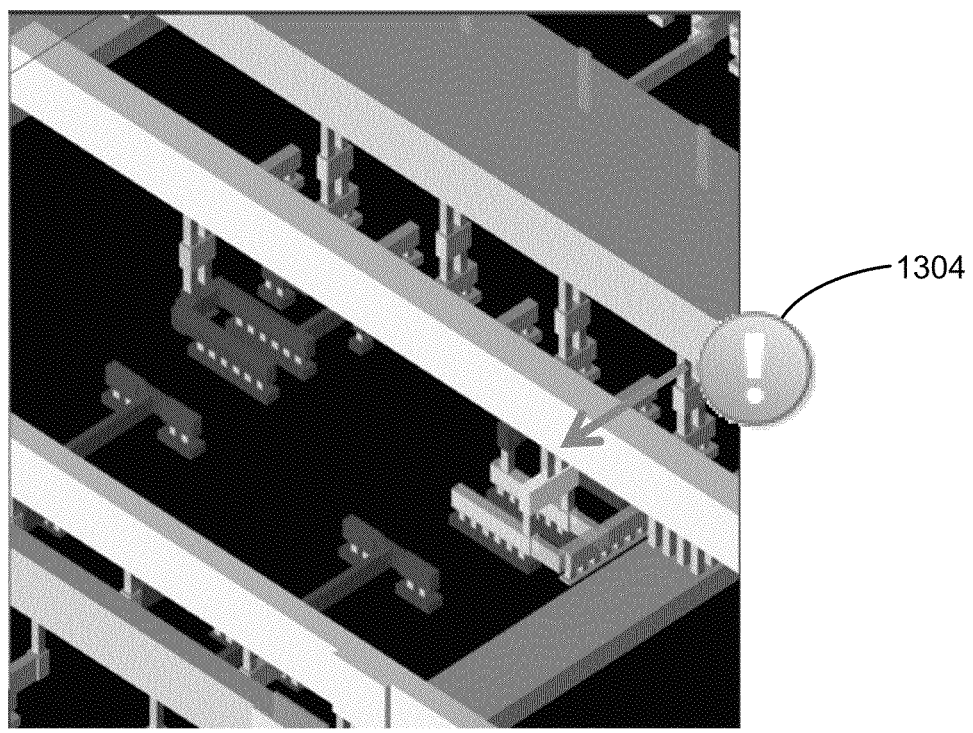
FIG. 13 shows an example of the critical error icon in a 3D view.

FIG. 13 shows an example of the critical error icon 1304 appearing in a 3D view. The critical error icon points to a potential problem in the circuit design and informs a user the location of interest by using an arrow.

Figure 14:
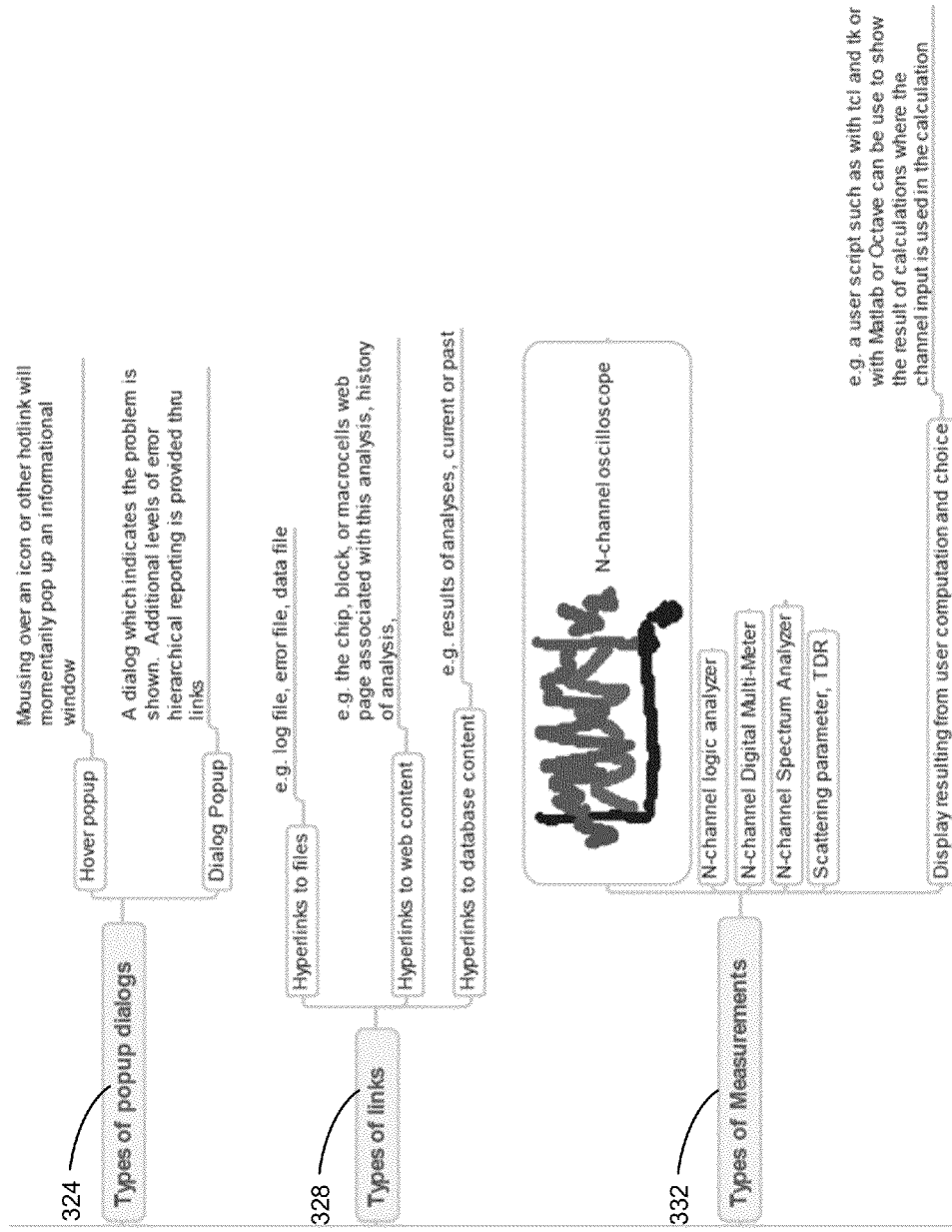
FIG. 14 shows examples of types of popup dialogues, types of links, and types of measurements.

FIG. 14 shows examples of types of popup dialogues 324, types of links 328, and types of measurements 332 (see also FIG. 3A). Examples of types of popup dialogues are a hover popup and a dialog popup. A hover popup will momentarily pop up an informational window when a user places the mouse over an icon or other hotlink and hovers over it.

Figure 15:
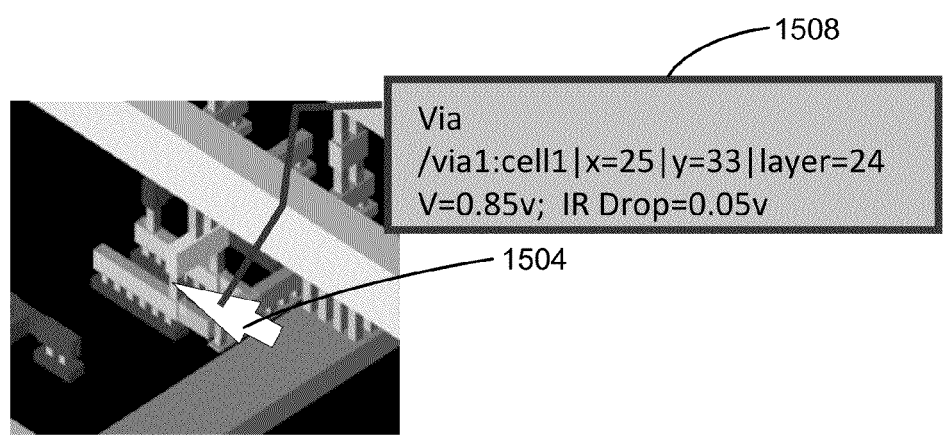
FIG. 15 shows an example of a hover popup.

FIG. 15 shows an example of a hover popup or pop up. A mouse 1504 is "hovered" over the particular feature or region of an integrated circuit and a hover popup 1508 appears on the screen. In this implementation, the feature shown is a via array, and the hover popup provides information about the via array. The via array is named vial, is at cell 1, with X and Y coordinate 25 and 33, respectfully, located at layer 24. The power of the via is 0.85 volts with an IR drop of 0.05 volts.

Referring back to FIG. 14, in a dialogue popup, a dialogue indicates a problem with the circuit. A contextual dialog may be shown which can be of any level of detail. Further, additional levels of error hierarchical reporting or information can be provided through links.

FIG. 14 shows examples of types of links such as hyperlinks to files, hyperlinks to web content, and hyperlinks to database content. Hyperlinks can provide a user easy access to information regarding the circuit by allowing a user to click on a link on the display screen. For example, hyperlinks to files can connect a user to files such as log files, error files, or data files. Hyperlinks to web content can connect user to the chip, block, or macrocells web page associated with this analysis, history of analysis, or real or test chip data. Hyperlinks to database content can connect a user to results of current or prior analysis of a circuit.

FIG. 14 shows examples of types of measurements to measure the characteristics of the circuits. For example, an N-channel oscilloscope, N-channel logic analyzer, N-channel digital multi-meter, N-channel spectrum analyzer, a scattering parameter, TDR, or a display resulting from user computation and choice can be used. For example, a user script (e.g., tcl and tk, Matlab, or Octave) can be used to show the result of calculations where the channel input is used in the calculation.

Figure 16:
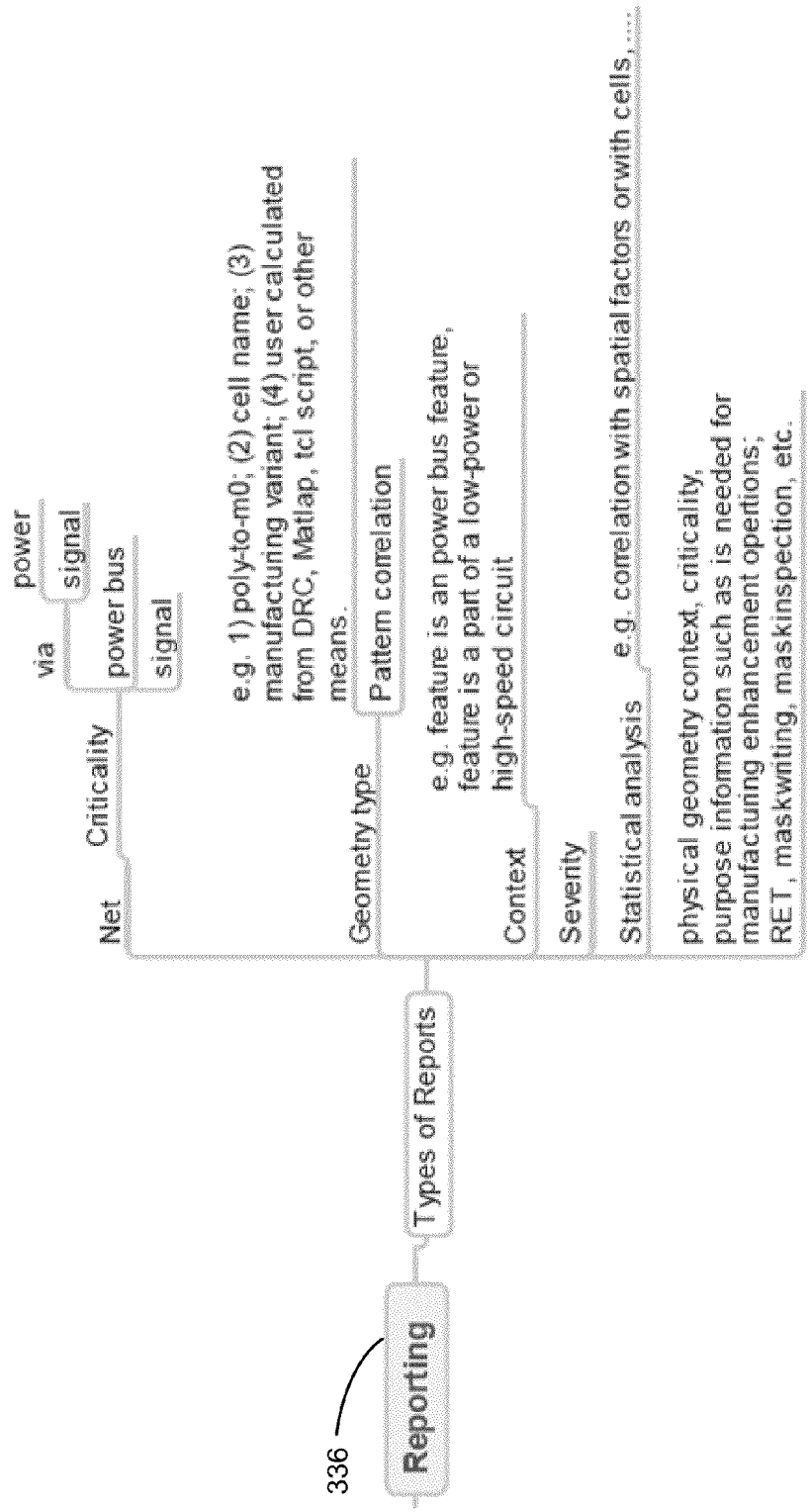
FIG. 16 shows a more detailed description of reporting.

FIG. 16 shows a more detailed description of reporting 336. Reporting can show different types of reports such as net reports, geometry types, context, severity, statistical analysis (e.g., correlation with spatial factors or with cells), physical geometry context, criticality, purpose information such as is needed for manufacturing enhancement operations (e.g., RET, mask writing, or mask inspection).

Net reports can include the criticality of via power and signal, power bus, and signal. Descriptions of geometry types can include poly-to-m0, cell name, manufacturing variant, user calculated from DRC, MATLAB, tcl script, or other means, or pattern correlation. Further, descriptions of context can include feature is a power bus feature or feature is a part of a lower-power or high-speed circuit.

Figure 17:
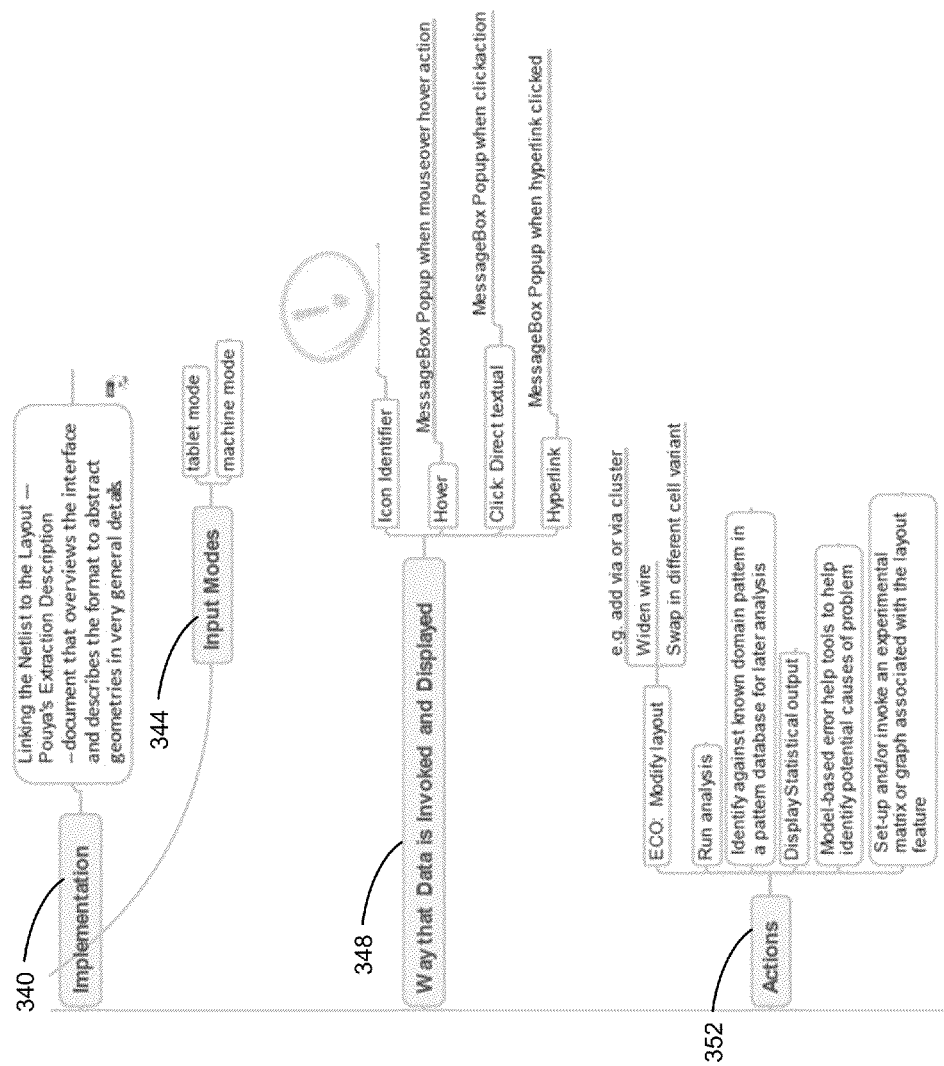
FIG. 17 shows a more detailed description of the implementation, input modes, way that data is invoked and displayed, and actions.

FIG. 17 shows a more detailed description of implementation 340, input modes 344, way that data is invoked and displayed 348, and actions 352. The circuit analysis can be implemented by linking the netlist to the layout (e.g., extraction description). This implementation can use a document that overviews the interface and describes the format to abstract geometries in general details.

Examples of input modes are a tablet mode and a machine mode. Other input modes are also possible.

Further, data may be invoked and displayed using an icon identifier, hovering a mouse or other input device over a feature or region of the circuit (e.g., message box popup when mouse over hover action), clicking directly on text (e.g., message box popup when click action), or hyperlink (e.g., message box popup when hyperlink is clicked). Data may be invoked or displayed through other means also.

Examples of actions are ECO: modify layout (e.g., add via or via cluster, widen wire, swap in different call variants), run analysis, identify against known domain pattern in a pattern database for later analysis, display statistical output, model-based error help tools to help identify potential causes of problems, or set-up or invoke an experimental matrix or graph associated with the layout feature.

Figure 18:
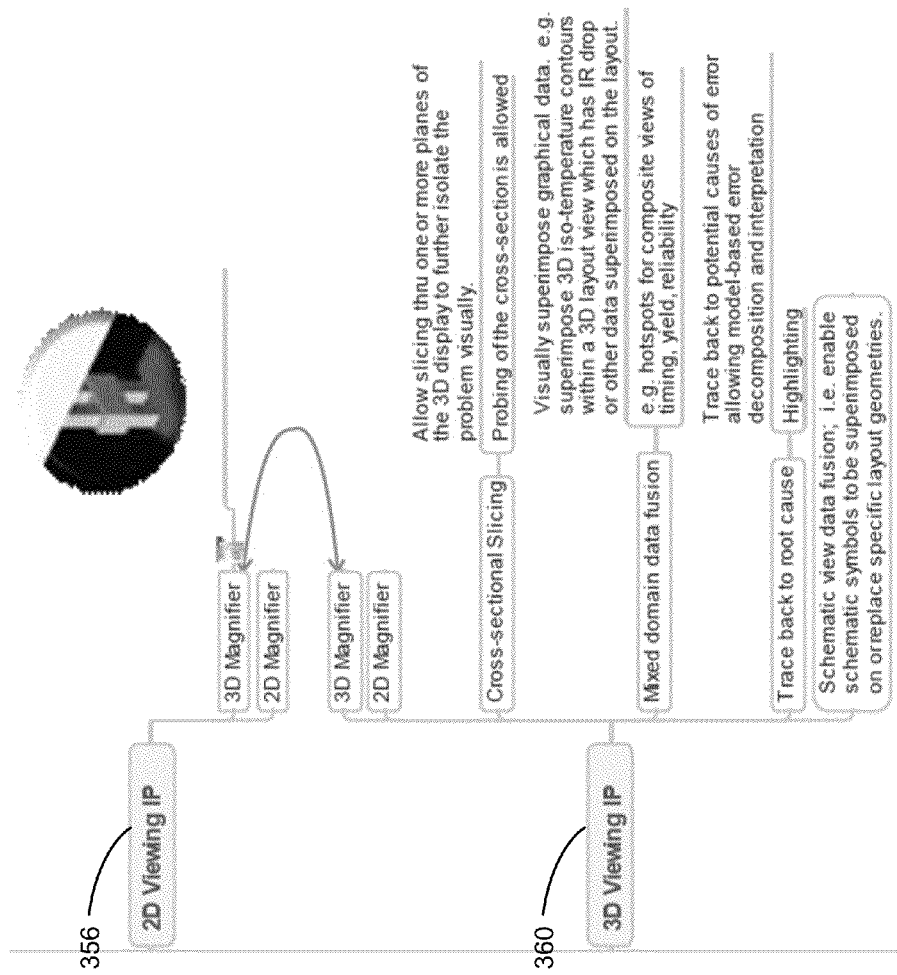
FIG. 18 shows a more detailed description of 2D viewing IP 356 and 3D viewing IP 360.

FIG. 18 shows a more detailed description of 2D viewing IP 356 and 3D viewing IP 360. A 2D viewing IP can have a 3D magnifier or a 2D magnifier, or both. A 3D viewing IP can have a 3D magnifier, 2D magnifier, cross-sectional slicing, mixed domain data fusion, trace back to root cause, or schematic view data fusion.

Allowing slicing through one or more planes of the 3D display to further isolate the problem visually will give a user more information regarding the cause of the problem. In an implementation, probing of the cross-section is allowed.

Visually superimposing graphical data on the 3D display will allow users to view more information in the display screen. For example, superimposing 3D iso-temperature contours within a 3D layout view which has IP drop or other data superimposed on the layout will allow a user to view more information on the display screen. For example, hotspots, for composite view of timing, yield, or reliability can be displayed.

In an implementation, the invention traces back to potential causes of error, allowing model-based error decomposition and interpretation. In an implementation, the invention uses highlighting for this feature.

Further, in an implementation, the invention enables schematic symbols to be superimposed on or replace specific layout geometries.

Figure 19:
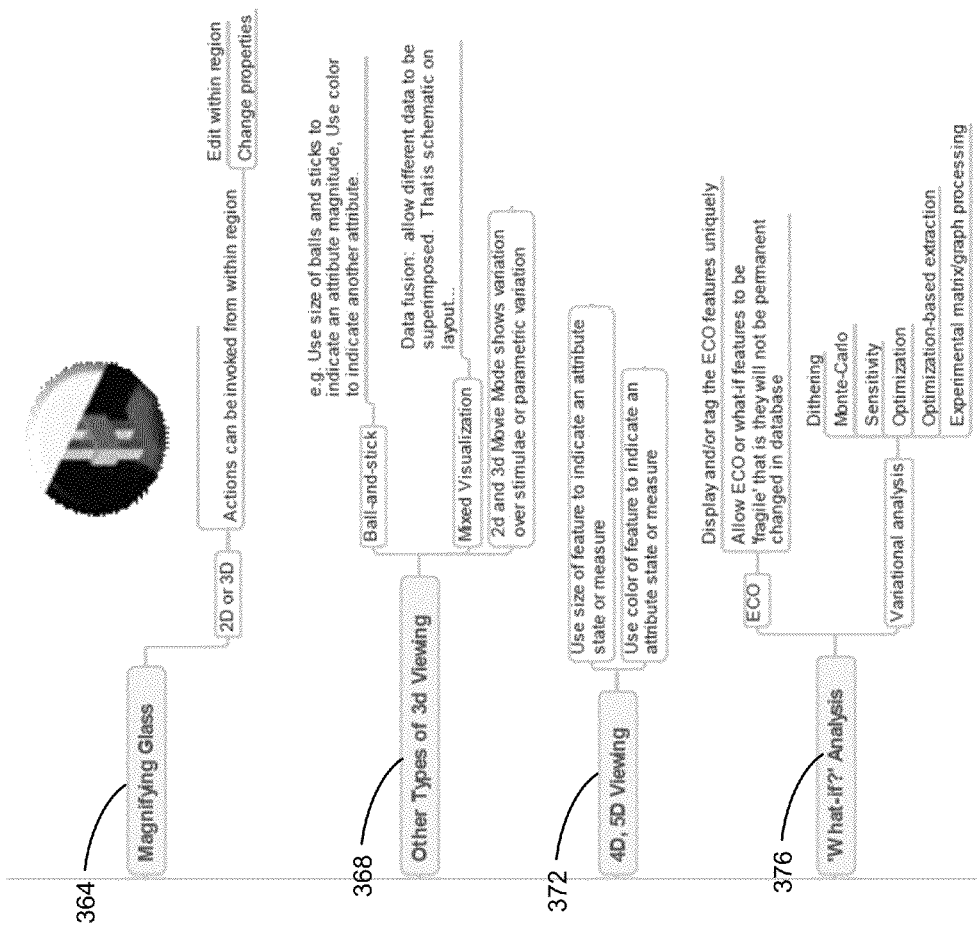
FIG. 19 shows a more detailed description of magnifying glass 364; other types of 3D viewing 368; 4D, 5D viewing 372; and "What-if" analysis 376.

FIG. 19 shows a more detailed description of magnifying glass 364; other types of 3D viewing 368; 4D, 5D viewing 372; and "What-if" analysis 376. The magnifying glass can be shown in the 2D or 3D view and actions can be invoked from within the region.

Figure 20:
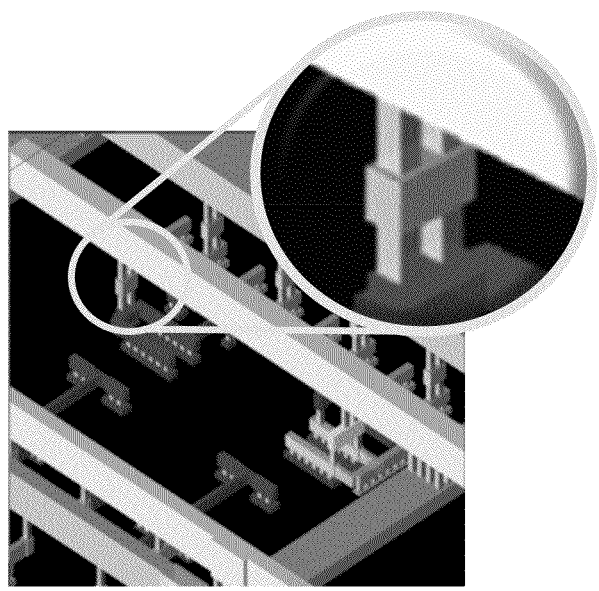
FIG. 20 shows an example of the 3D magnifying glass feature.

FIG. 20 shows an example of the 3D magnifying glass feature. The 3D magnifying glass feature allows a user to zoom in on a small local region in 3D. In an implementation, a user can edit within the region. In another implementation, a user can change properties of the circuit.

Referring back to FIG. 19, other types of 3D viewing are ball-and-stick, mixed visualization, and 2D and 3D movie mode. In an implementation, the ball-and-stick view uses sizes of balls and sticks to indicate an attribute magnitude and uses colors to indicate another magnitude. In the mixed visualization, data fusion allows different data to be superimposed on other data. Further, a 2D and 3D movie mode can show variation over stimulate or parametric variation.

Further, in an implementation, the 4D, 5D viewing uses a size of a feature to indicate an attribute state or measure. In another implementation, the 4D, 5D viewing uses a color of the feature to indicate an attribute state or measure.

The "What-if" analysis can use ECO or variation analysis. In an implementation, an ECO displays or tags the ECO features uniquely. In another implementation, an ECO or what-if feature is allowed to be "fragile" (e.g., they will not be permanent and can be changed in the database). Examples of variational analysis are dithering, Monte-Carlo, sensitivity, optimization, optimization-based extraction, and experimental matrix/graph processing.

Figure 21:
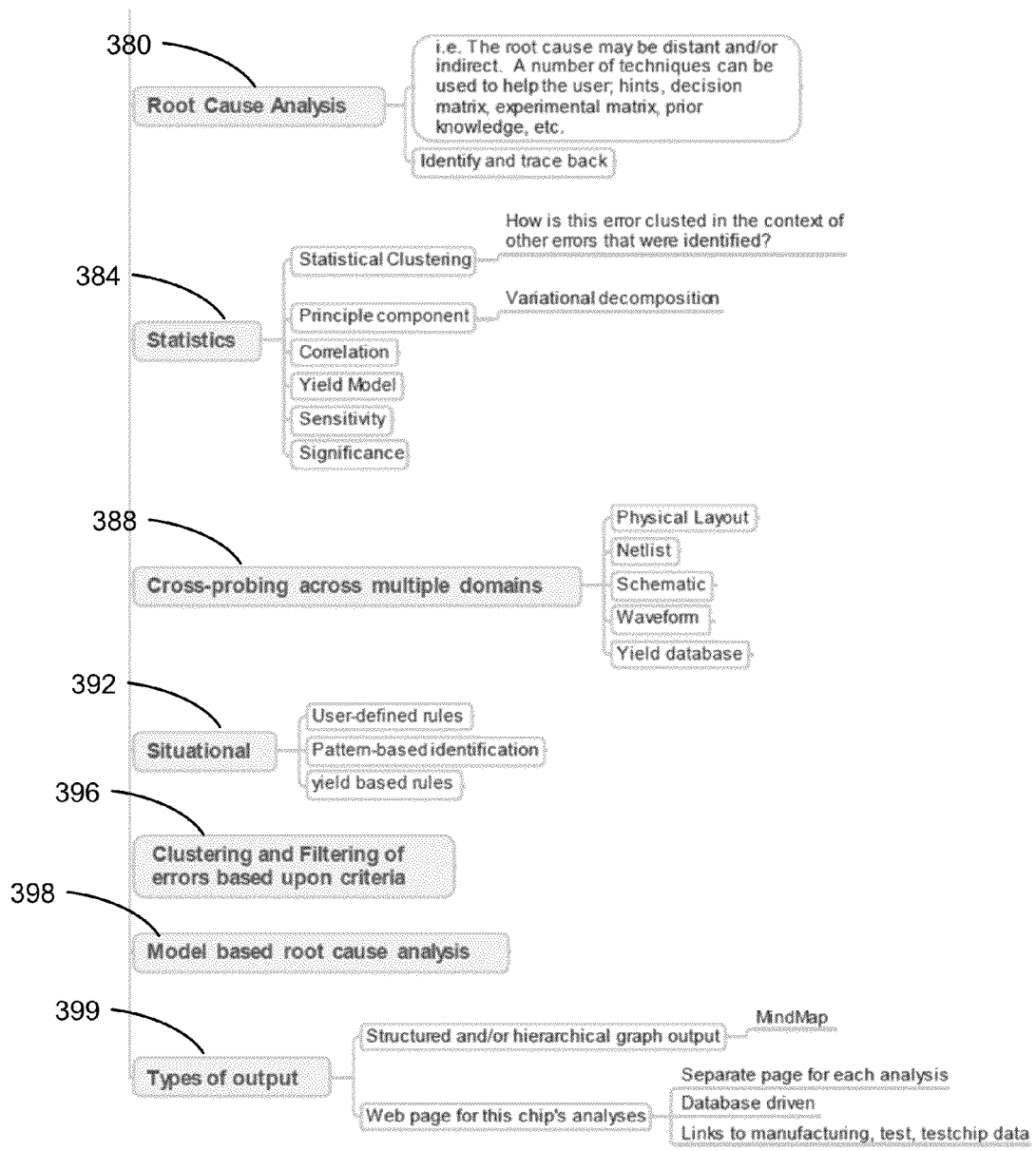
FIG. 21 shows a more detailed description of root cause analysis 380, statistics 384, cross-probing across multiple domains 388, situational 392, clustering and filtering of errors based upon criteria 396, model based root cause analysis 398, and types of output 399. The root cause analysis may be distant or indirect.

FIG. 21 shows a more detailed description of root cause analysis 380, statistics 384, cross-probing across multiple domains 388, situational 392, clustering and filtering of errors based upon criteria 396, model based root cause analysis 398, and types of output 399. The root cause analysis may be distant or indirect. A number of techniques can be used to help the user (e.g., hints, decision matrix, experimental matrix, or prior knowledge). In an implementation, the root cause analysis identifies problems in the circuit or features specified by a user and traces back.

Examples of statistics are statistical clustering (e.g., how is this error clustered in the context of other errors that were identified), principle component (e.g., variational decomposition), correlation, yield mode, sensitivity, or significance. Further, components that can be used for cross-probing across multiple domains are physical layout, netlist, schematic, waveform, or yield database.

In an implementation, a multidomain composite mode is provided that displays multiple datasets at the same time in 3D. For example, an IR drop is superimposed on a thermal distribution.

Different situations that can be taken into account are user-defined rules, pattern-based identification, or yield-based rules. Examples of types of output are structure or hierarchical graphical output (e.g., mind map) or web page for the chip's analysis (e.g., separate page for each analysis, database driven, or links to manufacturing, testing, or to the test chip data).

Figure 22:
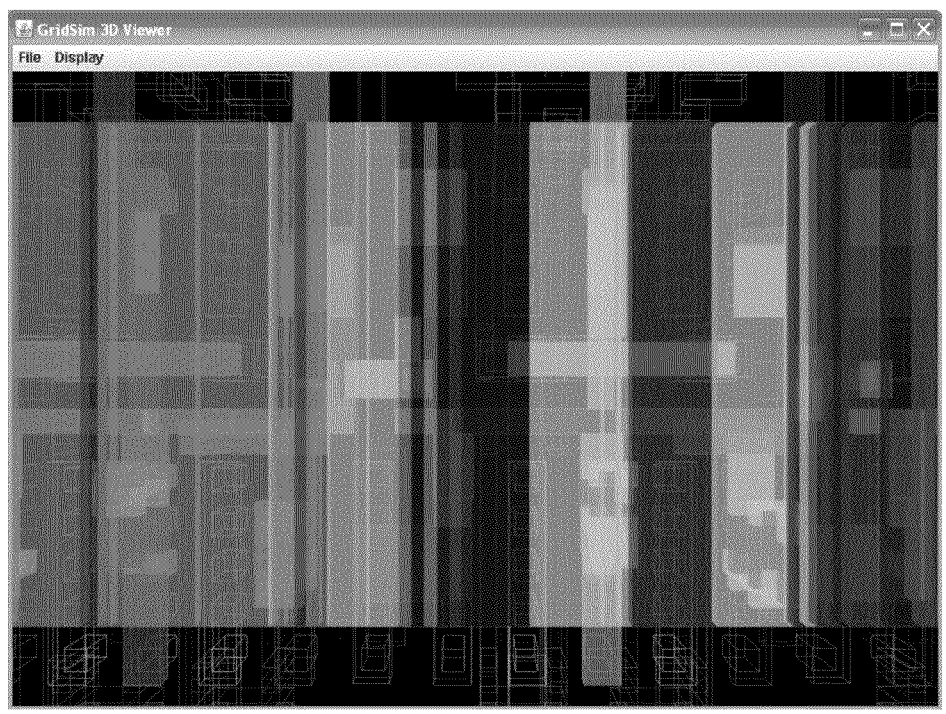
FIG. 22 shows a 2D view of a sample integrated circuit.

FIG. 22 shows a 2D view of a sample integrated circuit. The 2D view can show different areas of the integrated circuit divided according to a desired parameter. In an implementation, color is used to show the desired parameter. For example, one portion of the integrated circuit can be in a red color to indicate a higher voltage than portions of the integrated circuit in a blue color.

Figure 23:
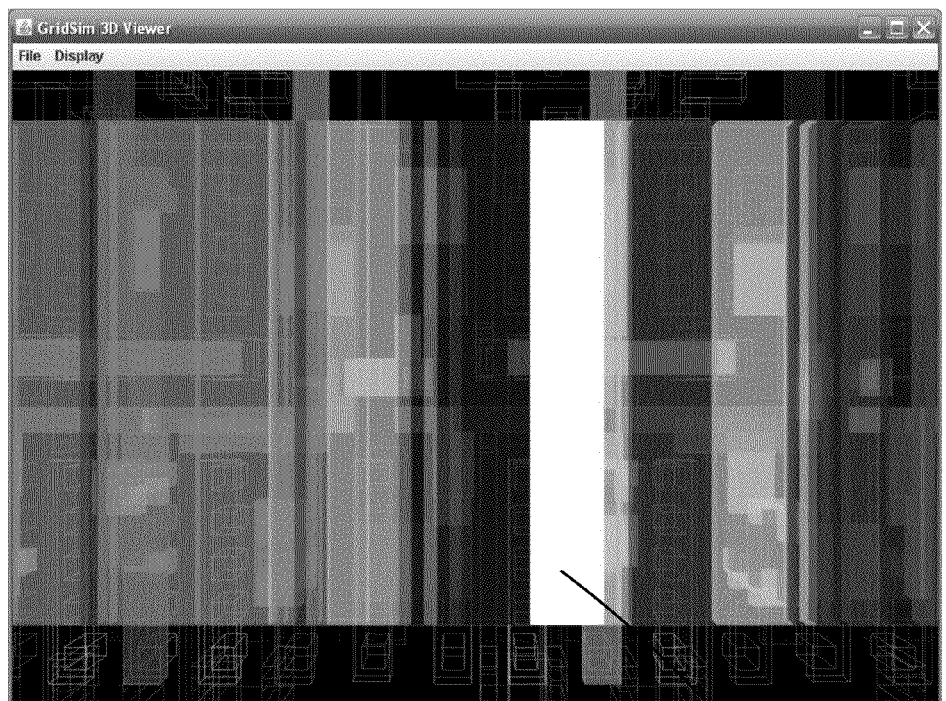
FIG. 23 shows a portion of the sample integrated circuit selected.

FIG. 23 shows a portion 2301 of the sample integrated circuit selected. This selection can be done by left-clicking the portion of the integrated circuit.

Figure 24:
FIG. 24 shows additional options for the portion of the sample integrated circuit selected.

FIG. 24 shows additional options for the portion of the sample integrated circuit selected. These additional options can appear when right-clicking the selected portion of the integrated circuit. When the option "Set center" 2401 is selected, the highlighted portion is used as a center point for a 3D view, as shown in greater detail in FIG. 25.

Figure 25:
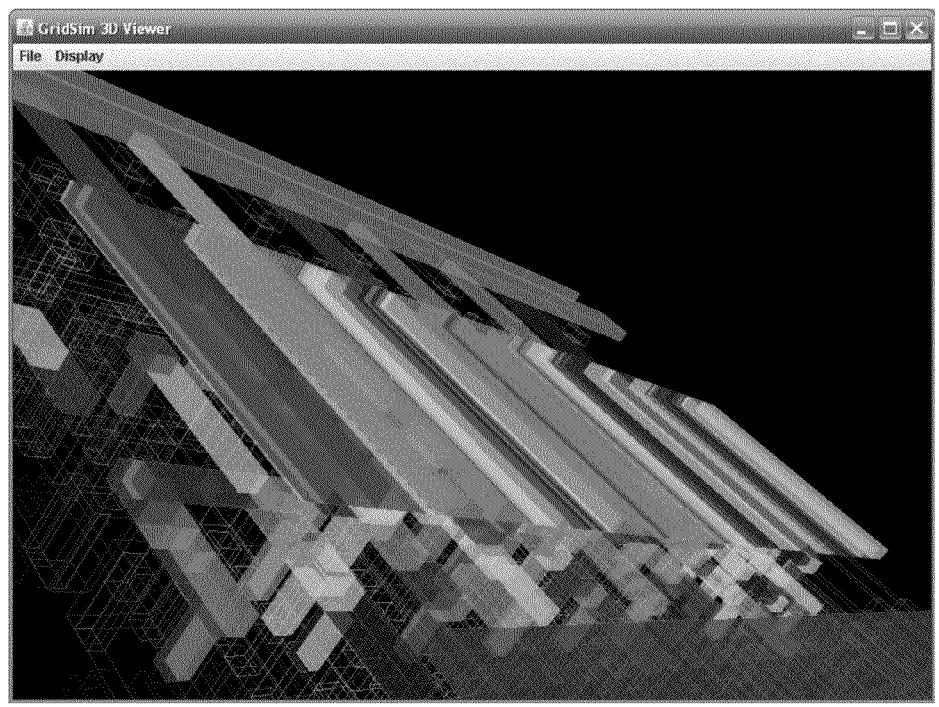
FIG. 25 shows the sample integrated circuit in 3D view.

FIG. 25 shows the sample integrated circuit in 3D view. The tilt and rotation while in this view is centered on a center point. The level of tilt and rotation of the 3D view can be adjusted. In an implementation, a user can adjust the tilt and rotation by moving their mouse (e.g., up and down and left and right).

Figure 26:
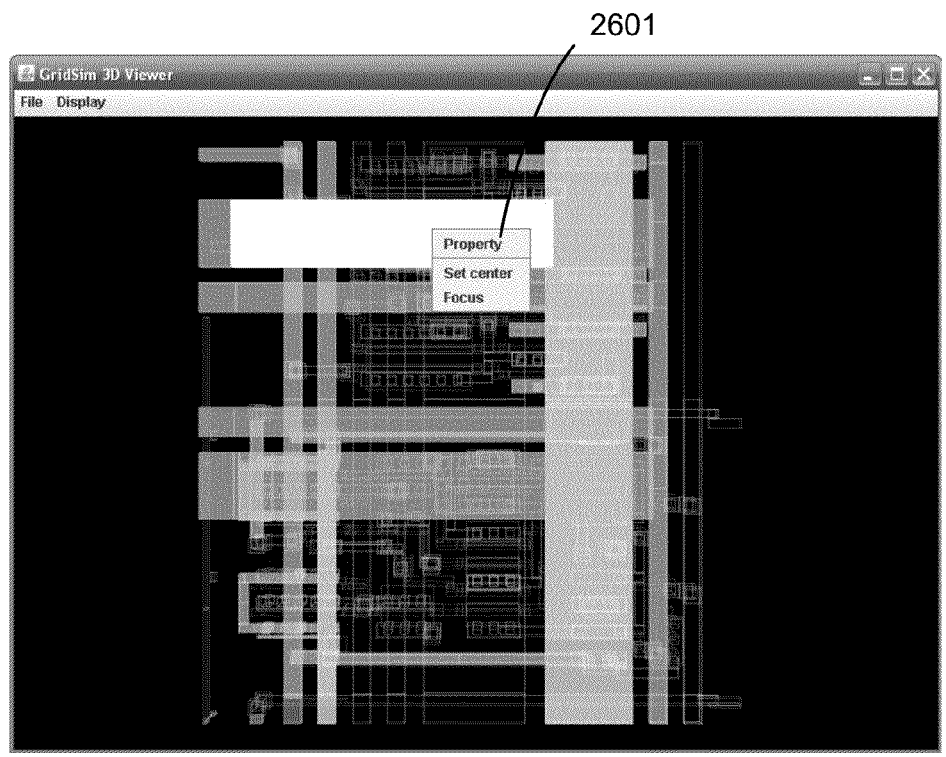
FIG. 26 shows selecting a portion of an integrated circuit.
Figure 27:
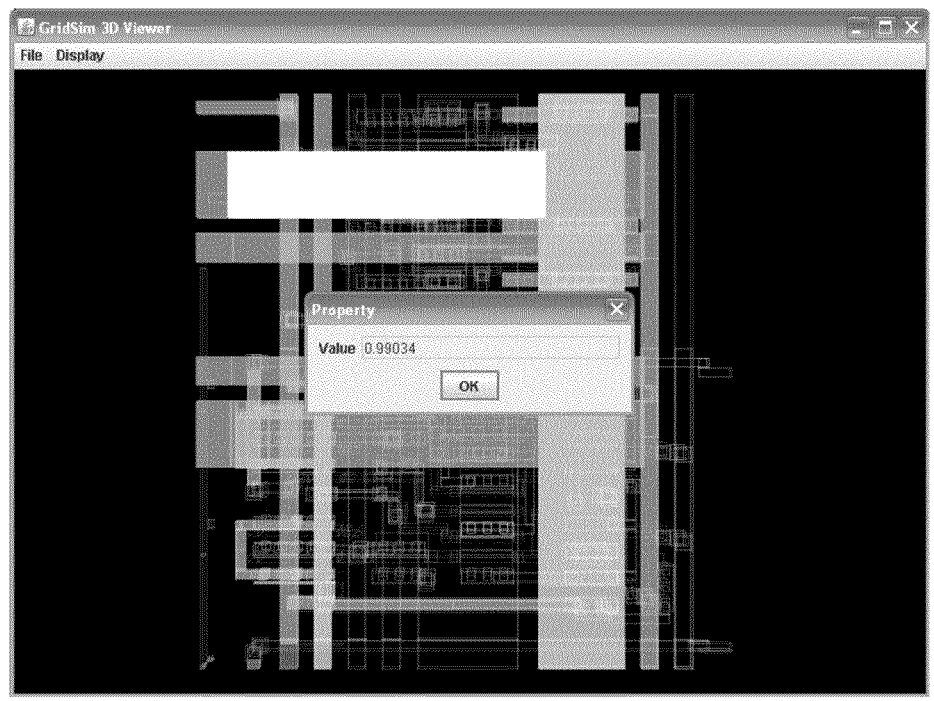
FIG. 27 shows a simulation result at the portion of the integrated circuit.

FIG. 26 shows selecting a portion of an integrated circuit. Once selected, clicking on "Property" 2601, will return the simulation result of the portion selected. In an implementation, the selection is done in a 3D view. FIG. 27 shows a simulation result at the portion of the integrated circuit. In the example, the result is 0.99034.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A system comprising:
a display two-dimensional view module that formats for display on a computer screen a layout of integrated circuit design in a two-dimensional view, wherein the integrated circuit design is specified in a design database, the layout comprises multiple layers, and in the two-dimensional view, layers of the layout overlap when two or more layers cross each other on the screen;
a user interface module that allows the user to identify a portion of the layout of the integrated circuit design using a pointer,
wherein the display two-dimensional view module allows displaying on the screen a zoomed-in view of the portion of the layout identified by the user, and
the user interface module provides an option for the user to enable a three-dimensional view of the layout;
a display three-dimensional view module that after the three-dimensional view option is enabled, formats for display on the screen at least the portion of the layout identified by the user in a three-dimensional view and allowing the user to select a reference point of rotation,
wherein after the reference point is selected, while the user moves the pointer relative to the reference point, showing on the screen and rotating a three-dimensional view of at least the portion of the layout identified by the user, and the rotation is based on the movement of the pointer relative to the selected reference point, and
the user interface module allows the user to select a feature on the screen with the pointer and request showing a property associated with that selected feature; and
a display property module that displays a value for the property of the selected feature on the screen.

2. The system of claim 1 wherein the property is not stored in the design database, but stored in a simulation results database.

3. The system of claim 1 wherein the pointer comprises at least one of a pointing device, mouse, stylus, touch screen, touch pad, or tablet.

4. The system of claim 1 wherein the design database is a GDSII database.

5. The system of claim 1 wherein the property is a voltage, determined through a circuit simulation.

6. The system of claim 1 wherein the property is a current, determined through a circuit simulation.

7. The system of claim 1 wherein the display property module that displays a value for the property of the selected feature on the screen comprises:
a search module that searches through a simulation results database to find a simulation result corresponding to the feature of the layout selected by the user.

8. The system of claim 1 wherein the display property module that displays a value for the property of the selected feature on the screen comprises:
a simulation module that performs a simulation of the integrated circuit design to obtain a simulation result for the feature of the layout selected by the user.

9. The system of claim 1 comprising:
a display multiple colors module that displays portions of the features of the layout of the integrated circuit using multiple colors, wherein for features having
a property value in a range from a value V1 to a value V2, using a first color,
the property value in a range from a value V3 to a value V4, using a second color, and
the property value in a range from a value V5 to a value V6, using a third color,
wherein the first, second, and third colors are different from each other, and V6 is greater than V5, which is greater than V4, which is greater than V3, which is greater than V2, which is greater than V1.

10. A method comprising:
formatting for display on a computer screen a layout of integrated circuit design in a two-dimensional view, wherein the integrated circuit design is specified in an design database, the layout comprises multiple layers, and in the two-dimensional view, layers of the layout overlap when two or more layers cross each other on the screen;
allowing the user to identify a portion of the layout of the integrated circuit design using a pointer;
displaying on the screen a zoomed-in view of the portion of the layout identified by the user;
providing an option for the user to enable a three-dimensional view of the layout;
after enabling the three-dimensional view option, formatting for display on the screen at least the portion of the layout identified by the user in a three-dimensional view and allowing the user to select a reference point of rotation;
after the reference point is selected, while the user moves the pointer relative to the reference point, showing on the screen and rotating a three-dimensional view of at least the portion of the layout identified by the user, wherein the rotation is based on the movement of the pointer relative to the selected reference point;
allowing the user to select a feature on the screen with the pointer and request showing a property associated with that selected feature; and
displaying a value for the property of the selected feature on the screen.

11. The method of claim 10 wherein the property is not stored in the design database, but stored in a simulation results database.

12. The method of claim 10 wherein the pointer comprises at least one of a pointing device, mouse, stylus, touch screen, touch pad, or tablet.

13. The method of claim 10 wherein the design database is a GDSII database.

14. The method of claim 10 wherein the property is a voltage, determined through a circuit simulation.

15. The method of claim 10 wherein the property is a current, determined through a circuit simulation.

16. The method of claim 10 wherein the displaying a value for the property of the selected feature on the screen comprises:

searching through a simulation results database to find a simulation result corresponding to the feature of the layout selected by the user.

17. The method of claim 10 wherein the displaying a value for the property of the selected feature on the screen comprises:

performing a simulation of the integrated circuit design to obtain a simulation result for the feature of the layout selected by the user.

18. The method of claim 10 comprising:

displaying portions of the features of the layout of the integrated circuit using multiple colors, wherein for features having a property value in a range from a value V1 to a value V2, using a first color, the property value in a range from a value V3 to a value V4, using a second color, and the property value in a range from a value V5 to a value V6, using a third color, wherein the first, second, and third colors are different from each other, and V6 is greater than V5, which is greater than V4, which is greater than V3, which is greater than V2, which is greater than V1.

19. The method of claim 18 comprising:

allowing enabling of a three-dimensional view of the layout while displaying the first, second and third colors.

20. The method of claim 10 wherein the property comprises an IR drop.

* * * * *